United States Patent
Son et al.

(10) Patent No.: US 10,916,279 B2
(45) Date of Patent: Feb. 9, 2021

(54) METHOD OF CONTROLLING ON-DIE TERMINATION AND SYSTEM PERFORMING THE SAME

(71) Applicant: SAMSUNG ELECTRONICS CO., LTD., Suwon-si (KR)

(72) Inventors: Young-Hoon Son, Suwon-si (KR); Si-Hong Kim, Hwaseong-si (KR); Chang-Kyo Lee, Seoul (KR); Jung-Hwan Choi, Hwaseong-si (KR); Kyung-Soo Ha, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/848,364

(22) Filed: Apr. 14, 2020

(65) Prior Publication Data
US 2020/0243123 A1 Jul. 30, 2020

Related U.S. Application Data

(63) Continuation of application No. 16/721,131, filed on Dec. 19, 2019, now Pat. No. 10,692,554, which is a
(Continued)

(30) Foreign Application Priority Data

May 29, 2017 (KR) .................. 10-2017-0066377
Jul. 14, 2017 (KR) .................. 10-2017-0089692

(51) Int. Cl.
*G11C 7/24* (2006.01)
*H03H 7/38* (2006.01)
*G11C 7/10* (2006.01)

(52) U.S. Cl.
CPC .............. *G11C 7/24* (2013.01); *G11C 7/1051* (2013.01); *G11C 7/1096* (2013.01); *H03H 7/38* (2013.01)

(58) Field of Classification Search
CPC ....... G11C 7/24; G11C 7/1051; G11C 7/1096; H03H 7/38
See application file for complete search history.

(56) References Cited

U.S. PATENT DOCUMENTS 7,259,585 B2 * 8/2007 Brinkman ............... H01L 23/34
326/30
7,342,411 B2 * 3/2008 Vergis .................... G11C 5/063
326/30

(Continued)

FOREIGN PATENT DOCUMENTS

JP  2011-176816  9/2011
JP  2017-027638  2/2017

*Primary Examiner* — Kurtis R Bahr
(74) *Attorney, Agent, or Firm* — F. Chau & Associates, LLC

(57) ABSTRACT

A method of controlling on-die termination (ODT) in a multi-rank system including a plurality of memory ranks is provided. The method includes: enabling ODT circuits of the plurality of memory ranks into an initial state when the multi-rank system is powered on; enabling the ODT circuits of a write target memory rank and non-target memory ranks among the plurality of memory ranks during a write operation; and disabling the ODT circuit of a read target memory rank among the plurality of memory ranks while enabling the ODT circuits of non-target memory ranks among the plurality of memory ranks during a read operation.

20 Claims, 23 Drawing Sheets

Related U.S. Application Data continuation of application No. 15/918,526, filed on Mar. 12, 2018, now Pat. No. 10,566,038.

(56) References Cited

U.S. PATENT DOCUMENTS

| | | | | |
|---|---|---|---|---|
| 7,414,426 | B2* | 8/2008 | Cox | H04L 25/0298 |
| | | | | 326/30 |
| 8,169,233 | B2* | 5/2012 | Ferolito | G06F 13/4086 |
| | | | | 326/30 |
| 8,588,012 | B2 | 11/2013 | Wilson et al. | |
| 8,619,492 | B2* | 12/2013 | Jeon | G11C 7/222 |
| | | | | 365/233.16 |
| 9,001,597 | B2* | 4/2015 | Koshizuka | G11C 7/1057 |
| | | | | 365/191 |
| 10,566,038 | B2 | 2/2020 | Son et al. | |
| 2010/0082911 | A1* | 4/2010 | Das | H03K 19/0005 |
| | | | | 711/154 |
| 2010/0182817 | A1* | 7/2010 | Koshizuka | G11C 8/04 |
| | | | | 365/51 |
| 2011/0314200 | A1* | 12/2011 | Wilson | G06F 13/4086 |
| | | | | 710/316 |
| 2013/0254585 | A1* | 9/2013 | Zerbe | G06F 13/161 |
| | | | | 713/503 |
| 2014/0016404 | A1* | 1/2014 | Kim | G11C 7/1057 |
| | | | | 365/158 |
| 2014/0149631 | A1* | 5/2014 | Kim | G06F 13/4022 |
| | | | | 710/316 |
| 2015/0331817 | A1* | 11/2015 | Han | G06F 3/0683 |
| | | | | 710/308 |
| 2016/0028395 | A1* | 1/2016 | Bains | H03K 19/0008 |
| | | | | 326/30 |
| 2016/0291894 | A1* | 10/2016 | Yeung | G06F 13/4068 |
| 2017/0077928 | A1 | 3/2017 | Bains et al. | |
| 2017/0093400 | A1* | 3/2017 | Bains | G06F 3/0673 |
| 2018/0107406 | A1* | 4/2018 | O | G06F 3/0683 |
| 2018/0181344 | A1* | 6/2018 | Tomishima | G11C 7/20 |
| 2018/0342274 | A1 | 11/2018 | Son et al. | |

* cited by examiner

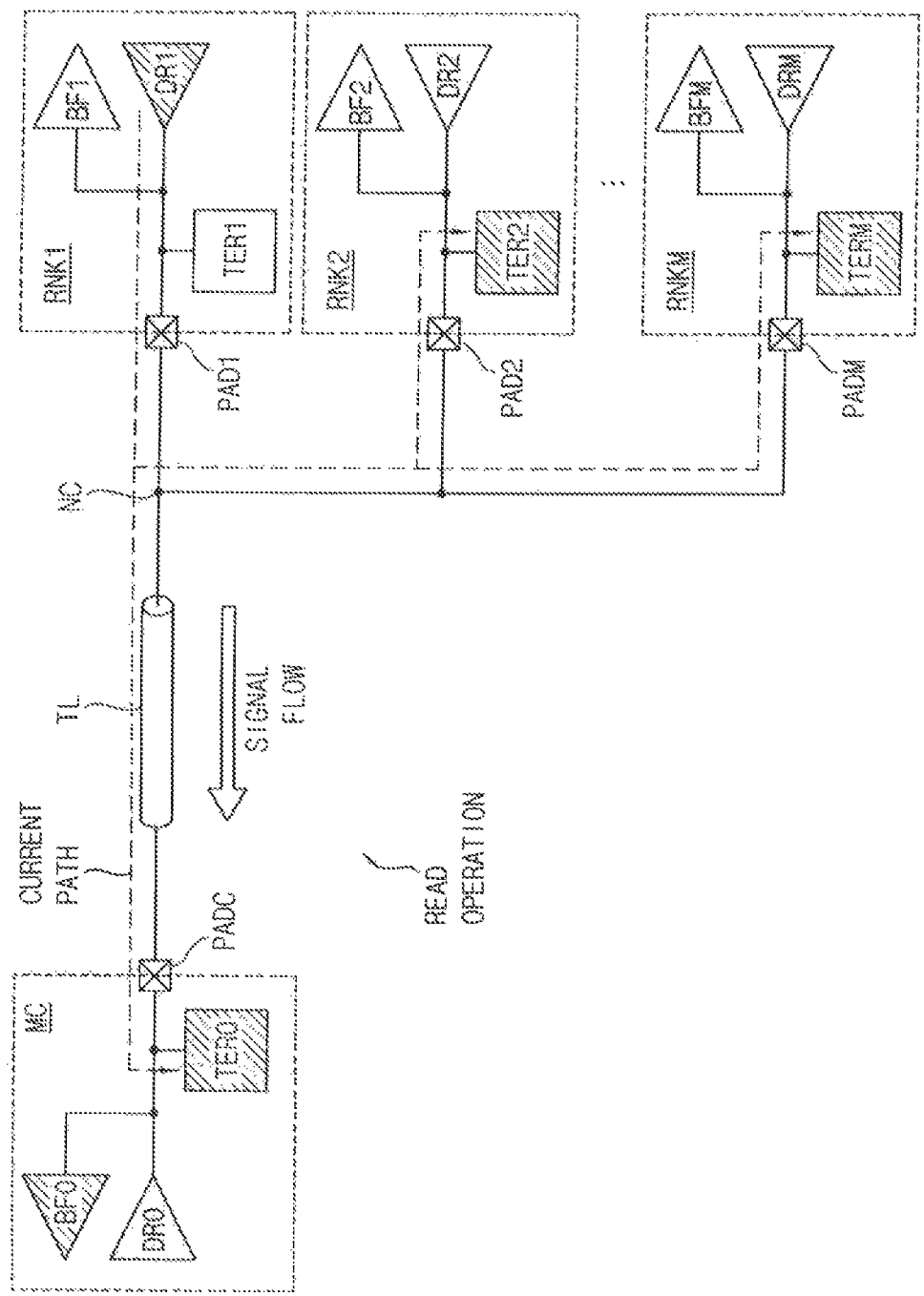

|  | RNK_TG | RNK_NT | MC |
|---|---|---|---|
| READ | DISABLED | M*Rtt | M*Rtt |
| WRITE | M*Rtt | M*Rtt | DISABLED |

|  | RNK_TG | RNK_NT | MC |
|---|---|---|---|
| READ | DISABLED | M*Rtt | M*Rtt |
| WRITE | M*Rtt+Rtg | M*Rtt | DISABLED |

FIG. 18

| CMD | CA0 | CA1 | CA2 | CA3 | CA4 | CA5 | CA6 |
|---|---|---|---|---|---|---|---|
| CAS | L | L | H | EDC_EN | WS_WR | WS_RD | WS_FAST |
| | DC0 | DC1 | DC2 | DC3 | NT0→RFU | NT1→RFU | BL |

FIG. 19A

| MRSET | OP7 | OP6 | OP5 | OP4 | OP3 | OP2 | OP1 | OP0 |
|-------|-----|-----|-----|-----|-----|-----|-----|-----|
|       | RFU ||||| ODT |||

FIG. 19B

| MRSET | OP7 | OP6 | OP5 | OP4 | OP3 | OP2 | OP1 | OP0 |
|-------|-----|-----|-----|-----|-----|-----|-----|-----|
|       | RFU || TG-ODT ||| NT-ODT |||

# METHOD OF CONTROLLING ON-DIE TERMINATION AND SYSTEM PERFORMING THE SAME

CROSS-REFERENCE TO RELATED APPLICATION

This U.S. Non-provisional application is a continuation application of U.S. patent application Ser. No. 16/721,131 filed on Dec. 19, 2019, which is a continuation application of U.S. patent application Ser. No. 15/918,526 filed Mar. 12, 2018, issued as U.S. Pat. No. 10,566,038 on Feb. 18, 2020, which claims priority under 35 USC § 119 to Korean Patent Application No. 10-2017-0066377 filed on May 29, 2017 and Korean Patent Application No. 10-2017-0089692 filed on Jul. 14, 2017, the disclosures of which are incorporated by reference in their entireties herein.

BACKGROUND

1. Technical Field

Exemplary embodiments relate generally to semiconductor integrated circuits, and more particularly to a method of controlling on-die termination and a system performing the method.

2. Discussion of Related Art

On-die termination (ODT) is introduced to enhance signal integrity by reducing signal reflection between a transmitter and a receiver. An ODT circuit may reduce the signal reflection by providing a termination resistance that is matched with an impedance of a transmission line. However, if ODT is implemented to enhance the signal integrity, power consumption may be increased.

SUMMARY

At least one embodiment of the inventive concept provides a method of controlling an ODT that is capable of reducing power consumption and enhancing signal integrity.

At least one embodiment of the inventive concept provides a system performing a method of controlling ODT that is capable of reducing power consumption and enhancing signal integrity.

According to an exemplary embodiment of the inventive concept, a method of controlling on-die termination (ODT) in a multi-rank system including a plurality of memory ranks, includes, enabling ODT circuits of the plurality of memory ranks into an initial state when the multi-rank memory system is powered on, enabling the ODT circuits of a write target memory rank and non-target memory ranks among the plurality of memory ranks during a write operation and disabling the ODT circuit of a read target memory rank among the plurality of memory ranks while enabling the ODT circuits of non-target memory ranks among the plurality of memory ranks during a read operation.

According to an exemplary embodiment of the inventive concept, a method of controlling on-die termination (ODT) in a memory device, includes, enabling an ODT circuit of the memory device into an initial state to have a first resistance value when the memory device is powered on, enabling the ODT circuit during a write operation with respect to the memory device and disabling the ODT circuit during a read operation with respect to the memory device.

According to an exemplary embodiment of the inventive concept, a system includes a plurality of memory ranks including a plurality of memory devices and a memory controller configured to control the plurality of memory ranks. On die termination (ODT) circuits of the plurality of memory ranks are enabled into an initial state when the system is powered on, the ODT circuits of the plurality of memory ranks are enabled during a write operation with respect to a write target memory rank and non-target memory ranks among the plurality of memory ranks and the ODT circuit of a read target memory rank among the plurality of memory ranks is disabled while the ODT circuits of non-target memory ranks among the plurality of memory ranks are enabled during a read operation.

According to an exemplary embodiment of the inventive concept, a system includes a first memory rank and a second memory rank. The first memory rank includes a plurality of first memory devices connected to a first on die termination (ODT) circuit. The second memory rank includes a plurality of second memory devices connected to a second ODT circuit. The first and second ODT circuits are enabled during a write operation of the first memory rank, and the first ODT circuit is disabled and the second ODT circuit is enabled during a read operation of the first memory rank.

The method of controlling ODT and the system performing the method according to exemplary embodiments may reduce power consumption and enhance signal integrity through static ODT control such that the ODT circuits of the target memory rank and the non-target memory ranks are maintained generally in the enabled state whereas the ODT circuit of the read target memory rank is disabled during the read operation.

BRIEF DESCRIPTION OF THE DRAWINGS

Exemplary embodiments of the present disclosure will be more clearly understood from the following detailed description taken in conjunction with the accompanying drawings.

FIGS. 9 and 10 are diagrams illustrating a method of controlling ODT in a read operation according to an exemplary embodiment of the inventive concept.

FIG. 18 is a diagram illustrating a CAS command according to an exemplary embodiment of the inventive concept.

FIGS. 19A and 19B are diagrams for describing a mode register for ODT according to an exemplary embodiment of the inventive concept.

DETAILED DESCRIPTION OF THE EXEMPLARY EMBODIMENTS

Figure 1:
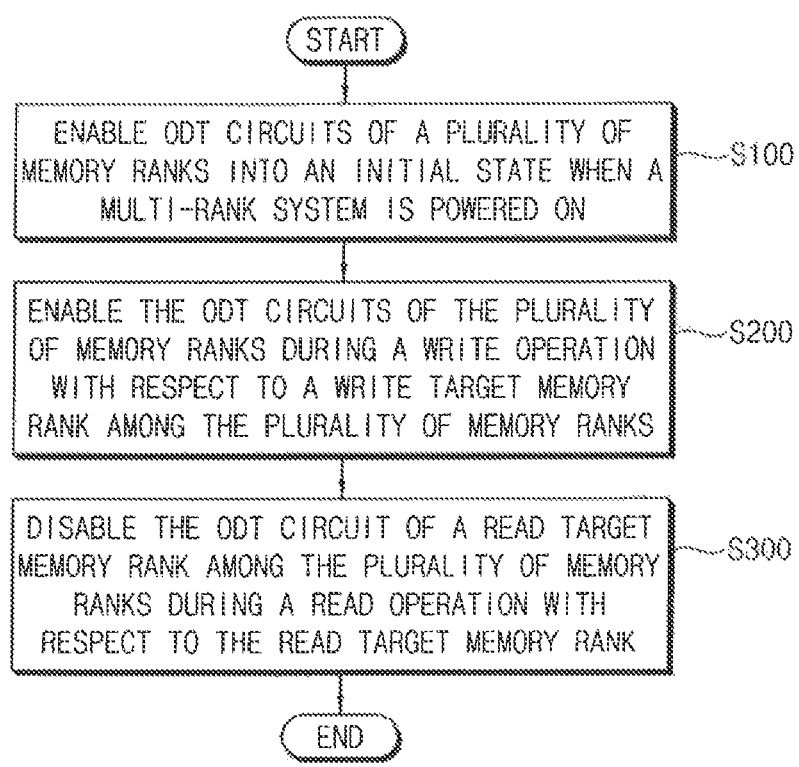
FIG. 1 is a flow chart illustrating a method of controlling on-die termination (ODT) according to an exemplary embodiment of the inventive concept.

The inventive concept will be described more fully hereinafter with reference to the accompanying drawings, in which some exemplary embodiments of the inventive concept are shown. In the drawings, like numerals refer to like elements throughout.

Figure 2:
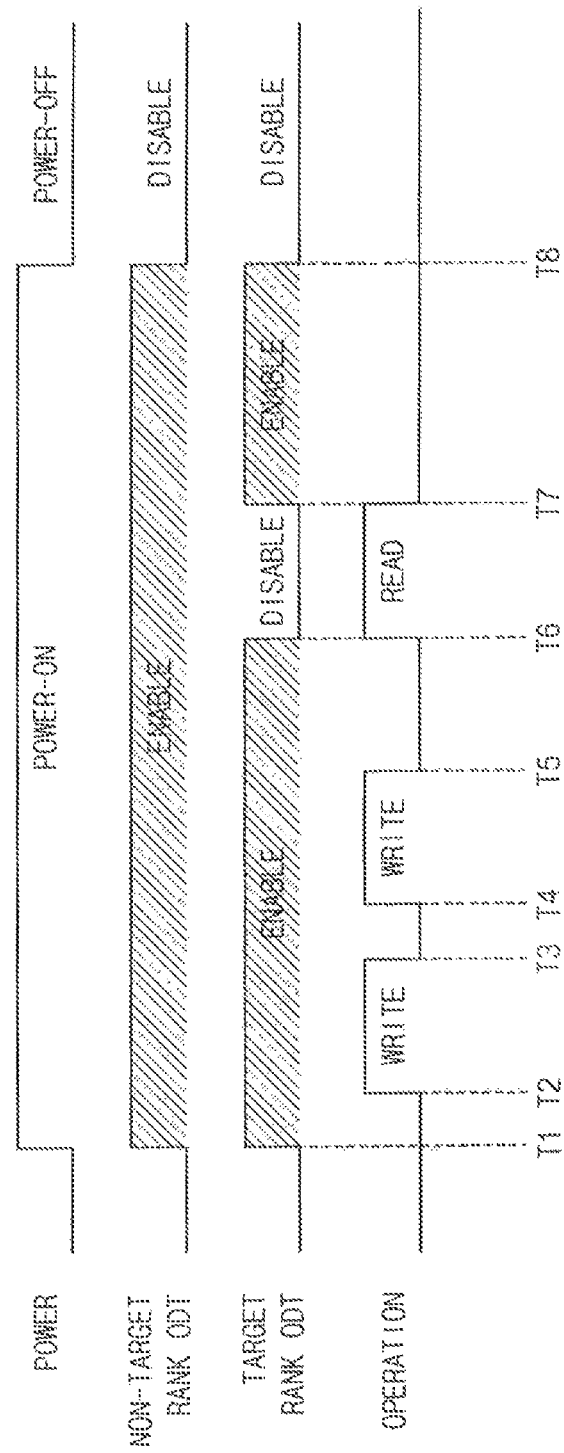
FIG. 2 is a timing diagram illustrating a method of controlling ODT according to an exemplary embodiment of the inventive concept.

FIG. 1 is a flow chart illustrating a method of controlling on-die termination (ODT) according to an exemplary embodiment of the inventive concept, and FIG. 2 is a timing diagram illustrating a method of controlling ODT according to an exemplary embodiment of the inventive concept.

FIGS. 1 and 2 illustrate a method of controlling ODT in a multi-rank system including a plurality of memory ranks. The multi-rank system will be described below with reference to FIG. 3. In an embodiment, a memory rank is a set of memory chips connected to the same chip select signal. Thus, when there are multiple memory ranks, each memory rank receives a different chips select signal. In a further embodiment, the set of memory chips for a given memory rank share the same command and control signals.

Referring to FIG. 1, ODT circuits of a plurality of memory ranks are enabled into an initial state when the multi-rank system is powered on (S100). For example, enabling the ODT circuits into an initial state may be performed by applying power to the ODT circuits and setting a resistance of each of ODT circuits to a same resistance value. The ODT circuits of the plurality of memory ranks are enabled during a write operation with respect to a write target memory rank among the plurality of memory ranks (S200). For example, if one of the ODT circuits of a memory rank that is currently the target of a write is currently disabled due to a previous read operation of the memory rank, then that ODT is enabled during the write. Further, the ODT circuit of the memory rank that is currently the target of the write may be enabled some time before the actual write. The ODT circuit of a read target memory rank among the plurality of memory ranks is disabled during a read operation with respect to the read target memory rank (S300).

A memory access operation may include a write operation and a read operation and the memory access operation may be differentiated from other operations such as a mode register write operation, a mode register read operation, a refresh operation, etc. In case of the write operation, the plurality of memory ranks may be divided by a write target memory rank that is an object of the write operation and non-target memory ranks except the write target memory rank. For example, during a write operation, data is written to one of a plurality of memory ranks (i.e., the write target memory rank) and the data is not written to the remaining memory ranks. In case of the read operation, the plurality of memory ranks may be divided by a read target memory rank that is an object of the read operation and non-target memory ranks except the read target memory rank. For example, during a read operation, data is read from one of a plurality of memory ranks (i.e., the read target memory rank) and data is not read from the remaining memory ranks. The write target memory rank or the read target memory rank may be simply referred to as a target memory rank.

Referring to FIG. 2, at time point T1 when the multi-rank system is powered on, the ODT circuits of the plurality of memory ranks are enabled into the initial state. In an exemplary embodiment, each of the ODT circuits of the plurality of memory ranks is set to have a first resistance value in the initial state. Even though FIG. 2 illustrates that an enabling time point of the ODT circuits coincides with power-on timing, the power-on sequence may be completed first and then after a certain time interval elapses the ODT circuits may be enabled into the initial state.

During time intervals T2-T3 and T4-T5 while the write operation is performed, all the ODT circuits of the memory ranks including the write target memory rank and the non-target memory ranks maintain an enabled state. In an exemplary embodiment, the ODT circuits of the plurality of memory ranks are maintained in the initial state to have the first resistance value during the write operation. In another exemplary embodiment, a resistance value of the ODT circuit of the write target memory rank is changed from the first resistance value to a second resistance value different from the first resistance value during the write operation.

During a time interval T6-T7 while the read operation is performed, the ODT circuit of the read target memory rank is disabled and the ODT circuits of the non-target memory ranks are enabled. In an exemplary embodiment, the ODT circuits of the non-target memory ranks are maintained in the initial state to have the first resistance value during the read operation. Even though FIG. 2 illustrates that the time interval of the disable of the read target memory rank coincides with the time interval of the read operation, the time interval of the disable of the read target memory rank may be less than the time interval of the read operation. In other words, it is sufficient that the ODT circuit of the read target memory rank is disabled only while read data is output through data input-output pins. For example, the ODT circuit of the read target memory rank may be disabled only while data read from the target memory rank is output through pins of the target memory rank.

At time point T8 when the multi-rank system is powered off, a power supply is blocked and the ODT circuits of all the memory ranks are disabled. For example, a switch may be present between a power supplied to the ODT circuits, and the blocking may be performed by opening the switch. For example, when the switch is a transistor, the switch may be opened based on a control signal applied to a gate of the transistor.

If only the ODT circuit of the target memory rank is enabled and the ODT circuits of the non-target memory ranks are disabled, signal integrity may be degraded because waves of signals injected to the non-target memory ranks are not terminated and thus jitters may be caused. In contrast, according to at least one embodiment of the inventive concept, signal integrity may be enhanced by enabling the ODT circuits almost always except the case of read target memory rank. Even though the ODT circuits of the non-target memory ranks are always enabled, standby power consumption is not caused in case of a pseudo-open drain termination as will be described below.

If the ODT circuits of the non-target memory ranks are enabled in the write operation and disabled in the read operation, all the memory ranks standby to receive and decode a memory access command (e.g., a write command or a read command). In this case, the ODT circuits do not enter a power-down mode and thus standby power consumption is increased. In contrast, according to an exemplary embodiment, the ODT circuits of the non-target memory ranks are maintained in the enabled state in the write operation and the read operation. In this case, the ODT circuits can enter the power-down mode more easily and thus the standby power consumption may be decreased.

In an embodiment, the ODT circuits of non-target memory ranks among the plurality of memory ranks have a constant resistance value regardless of the memory access command (e.g., a write command or a read command) output by the memory controller. This constant resistance value may be based on a value stored in the mode register.

In an exemplary embodiment, the plurality of memory ranks are informed what memory rank corresponds to the target memory rank for the write operation or the read operation based on a plurality of rank selection signals respectively provided to the plurality of memory ranks. In this case, all of the memory ranks in the standby state enter the power-down mode and the target memory rank corresponding to the activated rank selection signal is woken up from the power-down mode to the normal operation mode. The non-target memory ranks need not change the enabled state of the ODT circuits and thus the power-down mode may be maintained with respect to the non-target memory ranks.

As such, the method of controlling ODT and the system performing the method according to at least one embodiment may reduce power consumption and enhance signal integrity through static ODT control such that the ODT circuits of the target memory rank and the non-target memory ranks are maintained generally in the enabled state whereas the ODT circuit of the read target memory rank is disabled during the read operation.

Although a method of controlling ODT has been described for the multi-rank system with reference to FIGS. 1 and 2, the exemplary embodiment may be applied to a system including a memory device of a single memory rank.

In case of the single-rank system, the single memory device corresponds to the write target memory rank during the write operation and the read target memory rank during the read operation. According to an exemplary embodiment, an ODT circuit of the memory device is enabled into an initial state to have a first resistance value when the memory device is powered on. The ODT circuit may be enabled during the write operation with respect to the memory device and the ODT circuit may be disabled during the read operation with respect to the memory device.

Figure 3:
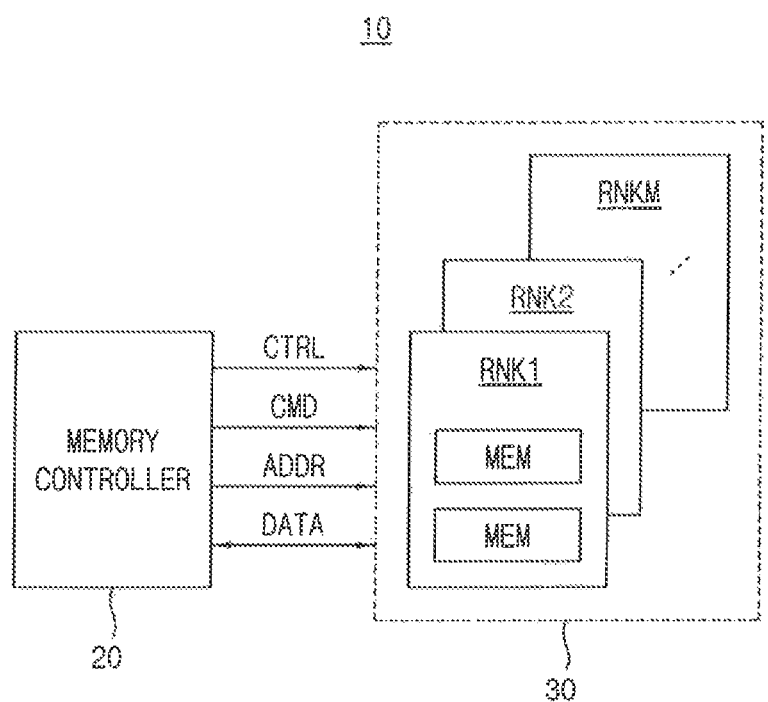
FIG. 3 is a block diagram illustrating a multi-rank system according to an exemplary embodiment of the inventive concept.

FIG. 3 is a block diagram illustrating a multi-rank system according to an exemplary embodiment of the inventive concept.

Referring to FIG. 3, a multi-rank system 10 includes a memory controller 20 and a memory sub system 30. The memory sub system 30 includes a plurality of memory ranks RNK1-RNKM and each of the memory ranks RNK1-RNKM includes one or more memory devices MEM, M is a natural number greater than 1. The memory controller 20 and the memory sub system 30 may include interface circuits, respectively, for mutual communication. The interface circuits may be connected through a control bus for transferring a command CMD, an address ADDR and a control signal CTRL, etc. and a data bus for transferring data. In an embodiment, the command CMD includes the address ADDR. The memory controller 20 may issue the command CMD and the address ADDR for accessing the memory sub system 30 and data may be written in the memory sub system 30 or data may be read out from the memory sub system 30 under the control of the memory controller 20. In an embodiment, the memory controller 20 includes separate pins for outputting the control signal CTRL, the command CMD, the address ADDR, and exchanging the data DATA with the memory sub system 30. When the command CMD includes the address ADDR, the memory controller 20 may omit the pin for outputting the address ADDR. According to an exemplary embodiment, ODT circuits of the plurality of memory ranks RNK1-RNKM are enabled into an initial state when the multi-rank system 10 is powered on, the ODT circuits of the plurality of memory ranks RNK1-RNKM are enabled during a write operation with respect to a write target memory rank among the plurality of memory ranks RNK1-RNKM and the ODT circuit of a read target memory rank among the plurality of memory ranks RNK1-RNKM is disabled during a read operation with respect to the read target memory rank.

Figure 4:
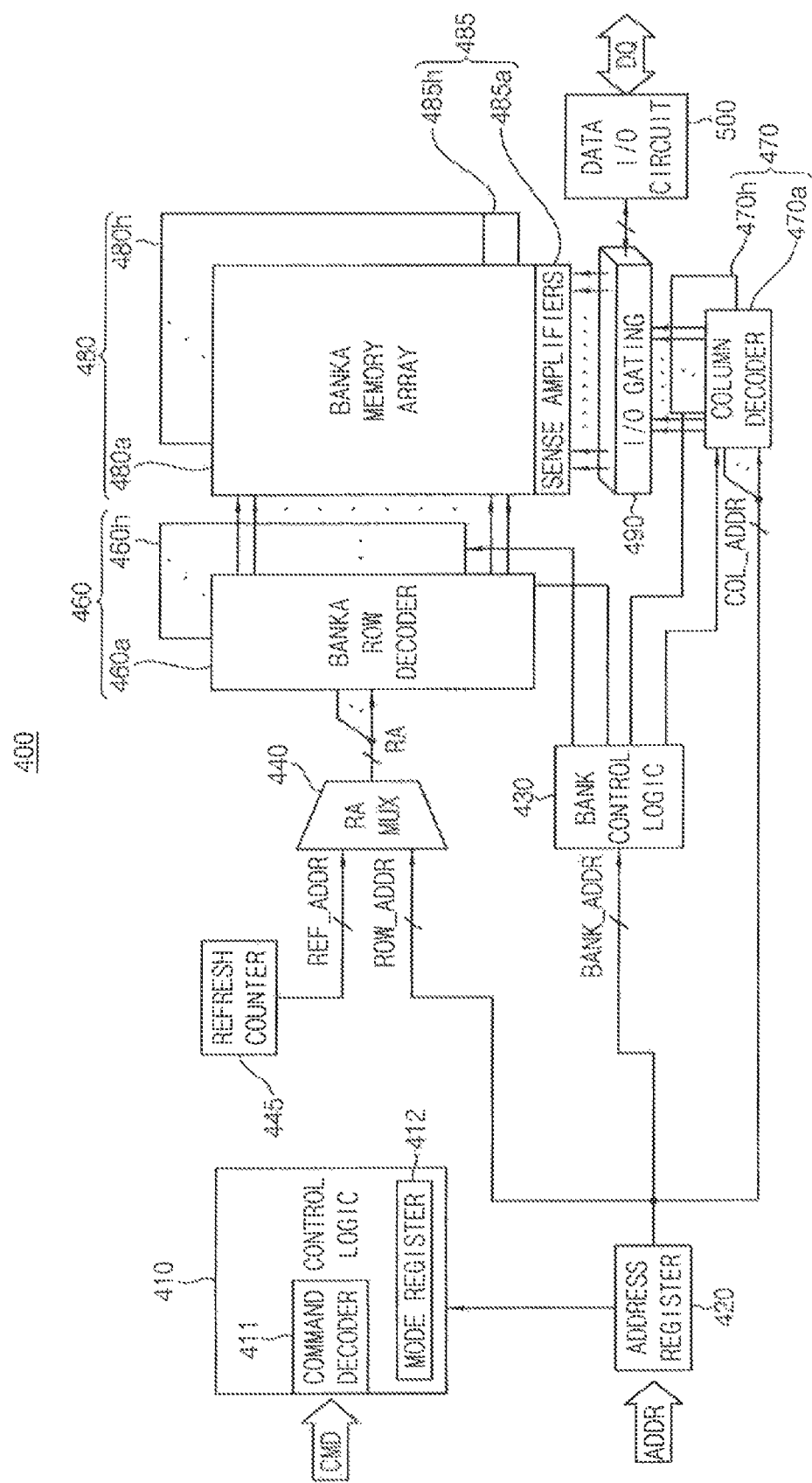
FIG. 4 is a block diagram illustrating an exemplary embodiment of a memory device included in the multi-rank system of FIG. 3.

FIG. 4 is a block diagram illustrating an exemplary embodiment of a memory device included in the multi-rank system of FIG. 3.

Referring to FIG. 4, a memory device 400 includes a control logic 410 (e.g., a control logic circuit), an address register 420, a bank control logic 430 (e.g., bank control logic circuit), a row address multiplexer 440, a refresh counter 445, a row decoder 460, a column decoder 470, a memory cell array 480, a sense amplifier unit 485 (e.g., sense amplifier circuit), an input-output (I/O) gating circuit 490 and a data input-output (I/O) circuit 500.

The memory cell array 480 includes a plurality of bank arrays 480a-480h. The row decoder 460 includes a plurality of bank row decoders 460a-460h respectively coupled to the bank arrays 480a-480h. The column decoder 470 includes a plurality of bank column decoders 470a-470h respectively coupled to the bank arrays 480a-480h. The sense amplifier unit 485 includes a plurality of bank sense amplifiers 485a-485h respectively coupled to the bank arrays 480a-480h.

The address register 420 receives an address ADDR including a bank address BANK_ADDR, a row address ROW_ADDR, and a column address COL_ADDR from the memory controller 20. The address register 420 provides the received bank address BANK_ADDR to the bank control logic 430, the received row address ROW_ADDR to the row address multiplexer 440, and the received column address COL_ADDR to a column decoder 470.

The bank control logic 430 may generate bank control signals based on the bank address BANK_ADDR. One of the bank row decoders 460a-460h corresponding to the bank address BANK_ADDR may be activated based on the bank control signals. One of the bank column decoders 470a-470h corresponding to the bank address BANK_ADDR may be activated based on the bank control signals.

The row address multiplexer 440 may receive the row address ROW_ADDR from the address register 420 and may receive a refresh row address REF_ADDR from the refresh counter 445. The row address multiplexer 440 may selectively output one of the row address ROW_ADDR or the refresh row address REF_ADDR as a row address RA. The row address RA output from the row address multiplexer 440 may be applied to the bank row decoders 460a-460h.

The activated one of the bank row decoders 460a-460h may decode the row address RA output from the row address multiplexer 440 and may activate a word-line corresponding to the row address RA. For example, the activated bank row decoder may apply a word-line driving voltage to the word-line corresponding to the row address RA.

The column decoder 470 may include a column address latch. The column address latch may receive the column address COL_ADDR from the address register 420 and temporarily store the received column address COL_ADDR. In an exemplary embodiment, in a burst mode, the column address latch generates column addresses that increment from the received column address COL_ADDR. The column address latch may apply the temporarily stored or generated column addresses to the bank column decoders 470a-470h.

The activated one of the bank column decoders 470a-470h may decode the column address COL_ADDR output from the column address latch and may control the input-output gating circuit 490 in order to output data corresponding to the column address COL_ADDR.

The I/O gating circuit 490 may include circuitry for gating input-output data. The I/O gating circuit 490 may further include read data latches for storing data output from the bank arrays 480a-480h, and write drivers for writing data to the bank arrays 480a-480h.

Data to be read from one bank array of the bank arrays 480a-480h may be sensed by a sense amplifier 485 coupled to the one bank array from which the data is to be read, and may be stored in the read data latches. The data stored in the read data latches may be provided to the memory controller 20 via the data I/O circuit 500. Data DQ to be written in one bank array of the bank arrays 480a-480h may be provided to the data I/O circuit 500 from the memory controller 20. The write driver may write the data DQ in one bank array of the bank arrays 480a-480h.

The control logic 410 may control operations of the memory device 400. For example, the control logic 410 may generate control signals for the memory device 400 in order to perform a write operation or a read operation. The control logic 410 may include a command decoder 411 that decodes a command CMD received from the memory controller 20 and a mode register set 412 that sets an operation mode of the memory device. For example, a value of a register in the mode register set 412 may indicate the operation mode of the memory device.

Figure 5:
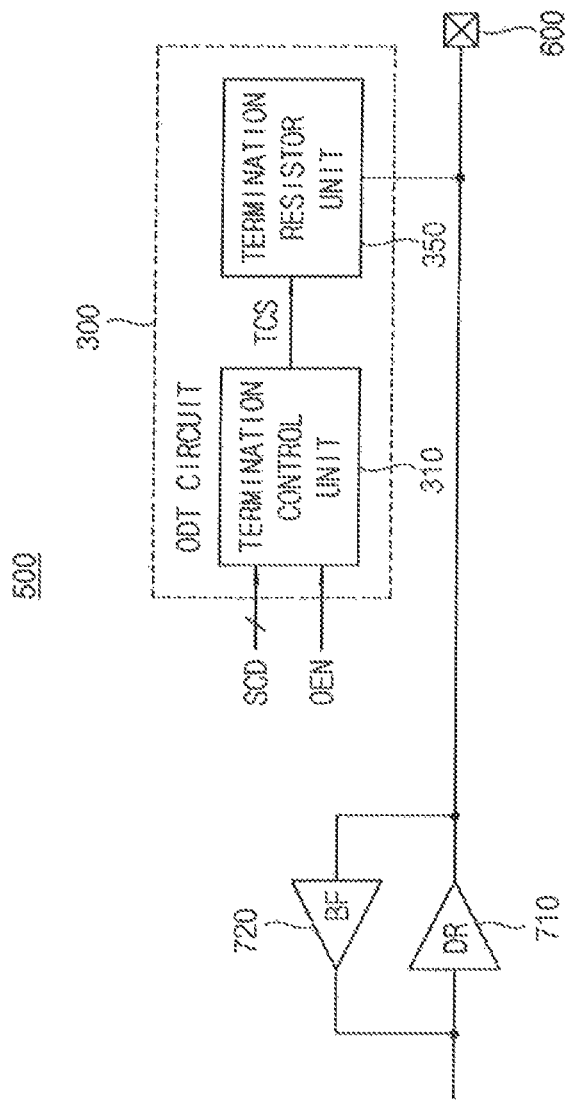
FIG. 5 is a block diagram illustrating an embodiment of a data input-output circuit included in the memory device of FIG. 4 according to an exemplary embodiment of the inventive concept.

FIG. 5 is a block diagram illustrating an embodiment of a data input-output circuit included in the memory device of FIG. 4 according to an exemplary embodiment of the inventive concept.

Referring to FIG. 5, a data input-output circuit 500 includes an ODT circuit 300, a data input-output pin 600, a transmission driver DR 710 and a reception buffer BF 720. The transmission driver 710 drives the data input-output pin 600 based on read data and the reception buffer 720 receives write data provided through the data input-output pin 600. For example, the read data is output from a memory of a memory rank to the transmission driver 710 and the memory controller outputs write data to the reception buffer 720. In an embodiment, the transmission driver DR 710 and the reception buffer BF 720 are implemented by an operational amplifier.

The ODT circuit 300 includes a termination control unit 310 (e.g., a termination control circuit) and a termination resistor unit 350.

The termination resistor unit 350 is coupled to the data input-output pin 600 and provides termination impedance to a transmission line coupled to the data input-output pin 600.

The method of controlling ODT according to an exemplary embodiment may be applied to control terminations of input-output pins for bidirectional communication between the memory controller 20 and the memory device 30. Thus the method according to an exemplary embodiment may be applied to a data strobe pin, a data mask pin, or a termination data strobe pin in addition to the data input-output pin 600. The ODT of an address pin, a command pin for unidirectional communication from the memory controller 20 to the memory device 30 is excluded from the method according to an exemplary embodiment. The term "pin" broadly refers to an electrical interconnection for an integrated circuit, e.g., a pad or other electrical contact on the integrated circuit.

In an embodiment, the termination resistor unit 350 performs a pull-up termination operation to provide termination resistance between a power supply voltage node and the data input-output pin 600 and/or a pull-down termination operation to provide termination resistance between a ground node and the data input-output pin 600. A center-tapped termination (CTT) for both of the pull-up and pull-down termination operations will be described below with reference to FIGS. 14A and 14B, a first pseudo-open drain (POD) termination for only the pull-down termination operation will be described below with reference to FIGS. 15A and 15B and a second POD termination for only the pull-up termination operation will be described below with reference to FIGS. 16A and 16B.

Even though FIG. 5 illustrates an exemplary embodiment where a distinct termination resistor unit 350 is equipped, a signal driver (not shown) itself in the transmission driver 710 may function as termination resistors. For example, in the write operation, the transmission driver 710 does not transmit read data and the transmission driver 710 functions as the termination resistor unit 350 while the reception buffer 720 is enabled to receive write data.

When the termination resistor unit 350 performs the pull-up termination operation, a voltage of the transmission line connected to the data input-output pin 600 may be maintained substantially at a level of the power supply voltage. As a result, a current flows through the termination resistor unit 350 and the transmission line only when data of a logic low level are transferred. In contrast, when the termination resistor unit 350 performs the pull-down termination operation, the voltage of the transmission line connected to the data input-output pin 600 may be maintained substantially at the ground voltage. As a result, a current flows through the termination resistor unit 350 and the transmission line only when data of a logic high level is transferred.

The termination control unit 310 (e.g., a termination control circuit) receives a strength code SCD and an output enable signal OEN. The termination control unit 310 generates a termination control signal TCS for controlling the termination resistor unit 350 to adjust the termination impedance based on the strength code SCD and the output enable signal OEN.

In an exemplary embodiment, the strength code SCD is a plurality of bits associated with a data rate. The data rate refers to an operating frequency of the memory device or a toggle rate of data that is transferred through the data input-output pin 600. For example, the termination impedance may be changed to a first impedance when the operating frequency is a first frequency and changed to a second termination when the operation frequency is a second other frequency. As will be described below with reference to FIGS. 19A and 19B, the strength code SCD of multiple bits may be provided based on the values stored in the mode register 412 in FIG. 4.

In an embodiment, the output enable signal OEN is activated during a read operation. While the output enable signal OEN is active, the termination control unit 310 provides a termination control signal TCS at a predetermined logic level to control the termination resistor unit 350 not to provide the termination impedance. In that case, the termination resistor unit 350 may be electrically decoupled from the data input-output pin 600 in response to the termination control signal TCS having the predetermined logic level. When the termination resistor unit 350 is electrically decoupled from the data input-output pin 600, the ODT circuit 300 or the termination resistor unit 350 may be referred to as "being disabled".

While the output enable signal OEN is deactivated during a write operation, the termination control unit 310 generates the termination control signal TCS to control the termination resistor unit 350 to provide the termination impedance. The termination control unit 310 may change a logic level of the termination control signal TCS in response to the strength code SCD to vary the termination impedance. For example, a value of the strength code SCD may indicate a particular termination impedance or resistance. If the termination resistor unit 350 was previously electrically decoupled from the data input-output pin 600, the termination resistor unit 350 is re-coupled to the data input-output unit 600 in response to application of the termination control signal TCS.

Figure 6:
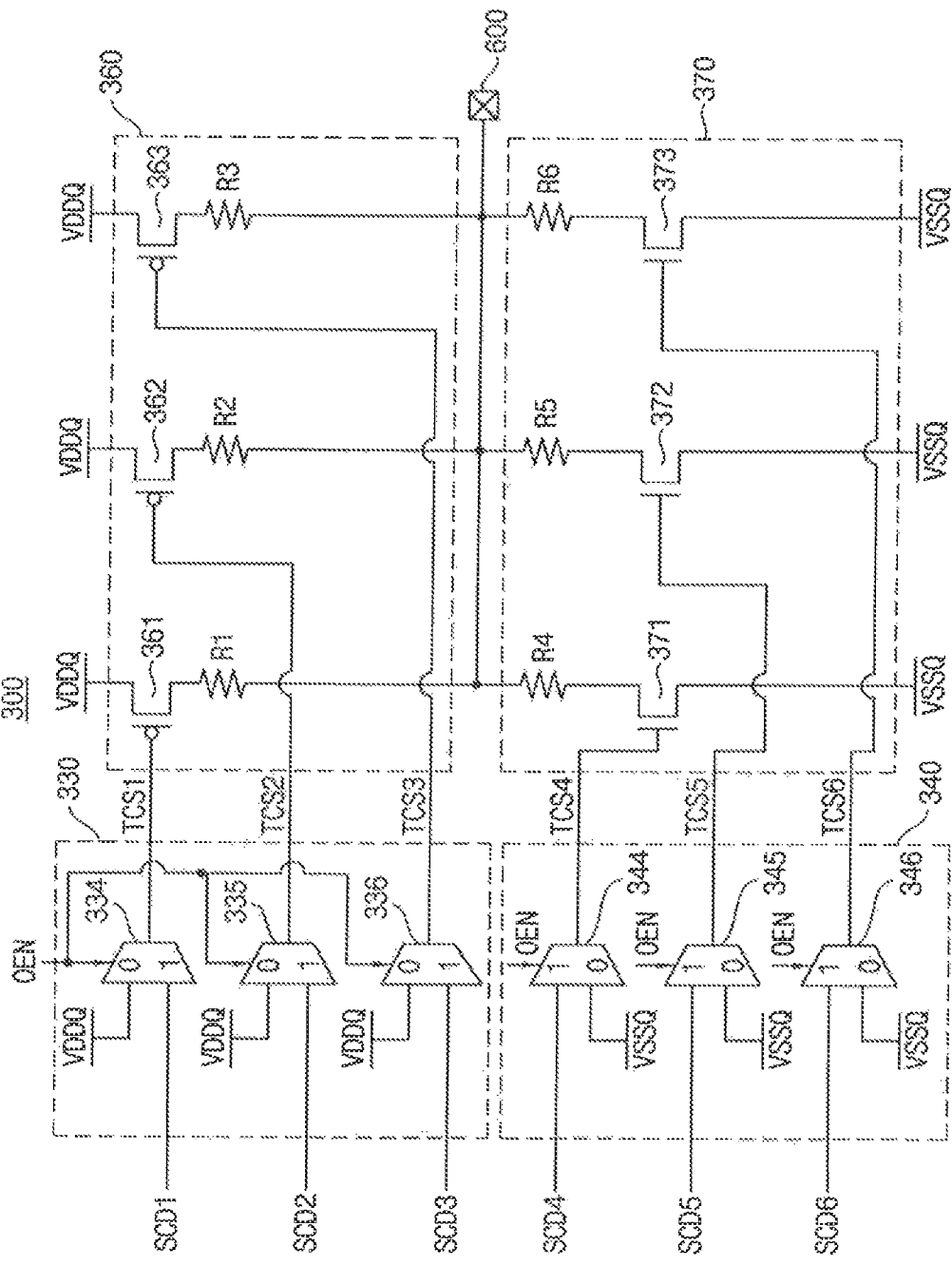
FIG. 6 is a circuit diagram illustrating an ODT circuit included in the data input-output circuit of FIG. 5 according to an exemplary embodiment of the inventive concept.

FIG. 6 is a circuit diagram illustrating an ODT circuit included in the data input-output circuit of FIG. 5 according to an exemplary embodiment of the inventive concept.

Referring to FIG. 6, an ODT circuit 300 includes a pull-up termination control unit 330, a pull-down termination control unit 340, a pull-up driver 360 and a pull-down driver 370.

The pull-up termination control unit 330 includes first to third selectors 334-336 (e.g., multiplexers), and the pull-down termination control unit 340 includes fourth to sixth selectors 344-346 (e.g., multiplexers). The pull-up driver 360 includes first to third PMOS transistors 361-363 and first to third resistors R1-R3. The first to third PMOS transistors 361-363 are connected to a power supply voltage VDDQ, and each of the first to third resistors R1-R3 is connected between a respective one of the first to third PMOS transistors 361-363 and the data input-output pin 600. The pull-down driver 370 includes first to third NMOS transistors 371-373 and fourth to sixth resistors R4-R6. The first to third NMOS transistors 371-373 are connected to a ground voltage VSSQ, and each of the fourth to sixth resistors R4-R6 is connected between a respective one of the first to third NMOS transistors 371-373 and the data input-output pin 600.

Each of the first to third selectors 334-336 may receive the power supply voltage VDDQ as each of first inputs, the first to third strength code bits SCD1, SCD2, and SCD3 as each of second inputs and the output enable signal OEN as each of control signals. Each of the fourth to sixth selectors 344-346 may receive the ground voltage VDDQ as each of first inputs, the fourth to sixth strength code bits SCD4, SCD5, and SCD6 as each of second inputs and the output enable signal OEN as each of control signals. The strength code SCD may include the strength code bits SCD1-SDC6.

While the output enable signal OEN is activated at a logic high level during a read operation, the first to third selectors 334-336 may output the first to third termination control signals TCS1, TCS2 and TCS3 of logic high level and the fourth to sixth selectors 344-346 may output the fourth to sixth termination control signals TCS4, TCS5 and TCS6 of logic low level. The first to third PMOS transistors 361-363 are turned off in response to the first to third termination control signals TCS1, TCS2 and TCS3 of logic high level and the fourth to sixth PMOS transistors 371-373 are turned off in response to the fourth to sixth termination control signals TCS4, TCS5 and TCS6 of logic low level. Thus the data input-output pin 600 is electrically disconnected from the power supply voltage VDDQ and the ground voltage VSSQ and the ODT circuit 300 is disabled during the read operation.

While the output enable signal OEN is activated at logic low level during a write operation, the first to third selectors 334-336 output the first to third strength code bits SCD1, SCD2 and SCD3 as the first to third termination control signals TCS1, TCS2 and TCS3 and the fourth to sixth selectors 344-346 output the fourth to sixth strength code bits SCD4, SCD5 and SCD6 as the fourth to sixth termination control signals TCS4, TCS5 and TCS6.

As described above, the strength code SCD, that is, the strength code bits SCD1-SCD6 may be associated with the data rate or the operating frequency. Accordingly, when the data rate is relatively high, channels are rapidly charged/discharged by decreasing the termination impedance. When the data rate is relatively low, current consumption may be reduced by increasing the termination impedance for decreasing DC currents flowing through the channels.

Although each of the first to sixth resistors R1-R6 is illustrated in FIG. 6 as a single resistor, in an exemplary embodiments each of the first to sixth resistors R1-R6 may be implemented with a plurality of resistors that are connected in parallel and/or in series and a plurality of transistors for controlling connections of the plurality of resistors.

Figure 14A:
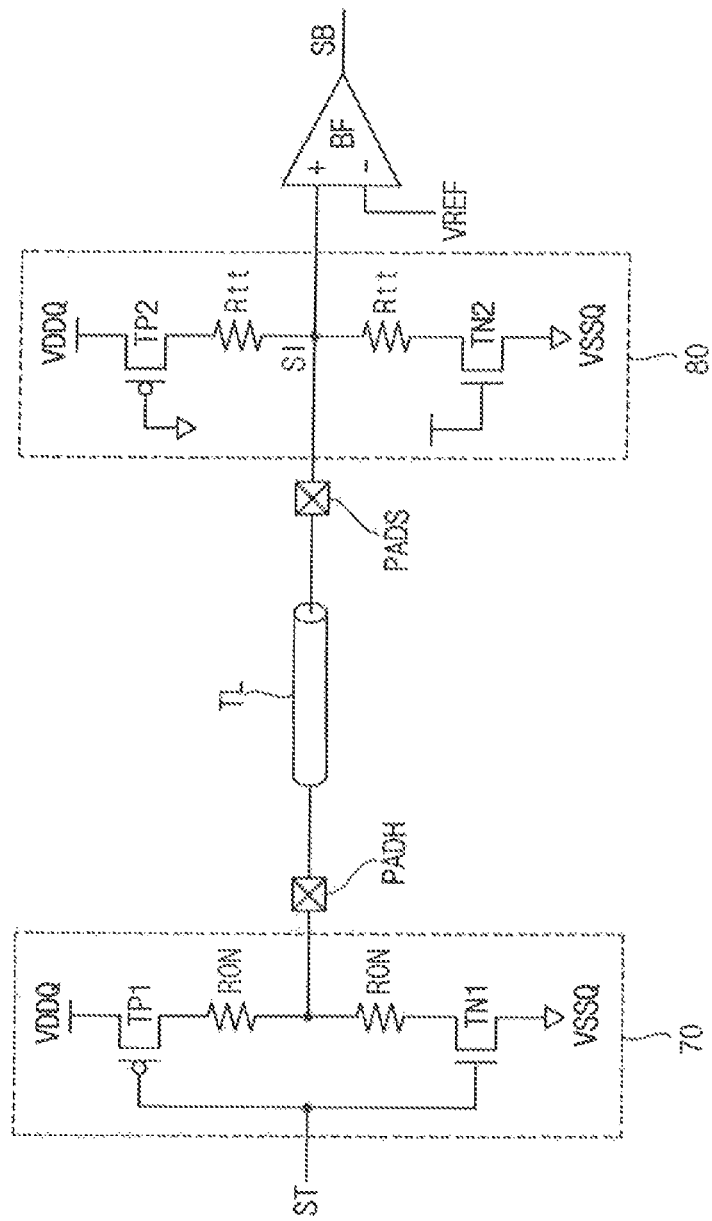
FIGS. 14A and 14B are diagrams for describing a center-tapped termination (CTT).
Figure 14B:
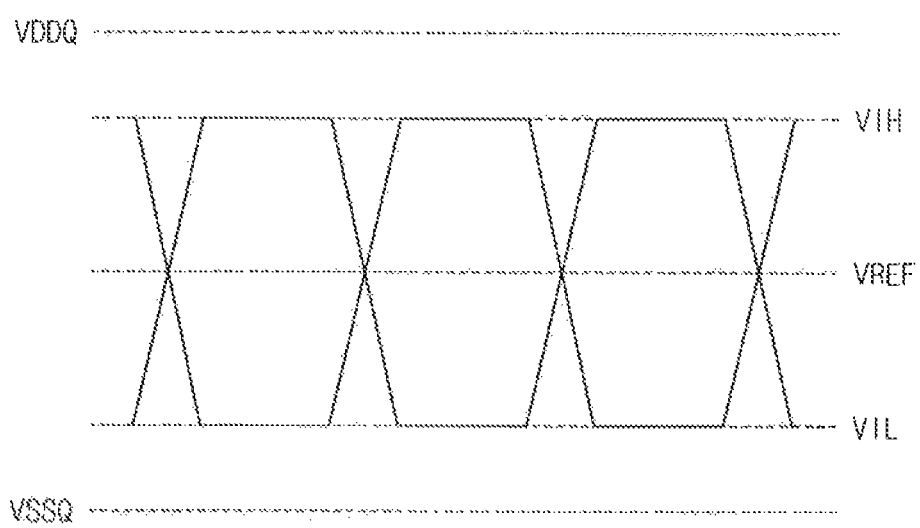

FIG. 6 illustrates an exemplary embodiment of the CTT scheme of FIGS. 14A and 14B, and the POD termination scheme may be understood therefrom. A configuration omitting the pull-up termination control unit 330 and the pull-up driver 360 from FIG. 6 corresponds to the first POD termination of FIGS. 15A and 15B and a configuration omitting the pull-down termination control unit 340 and the pull-down driver 370 from FIG. 6 corresponds to the second POD termination of FIGS. 16A and 16B.

Figure 7:
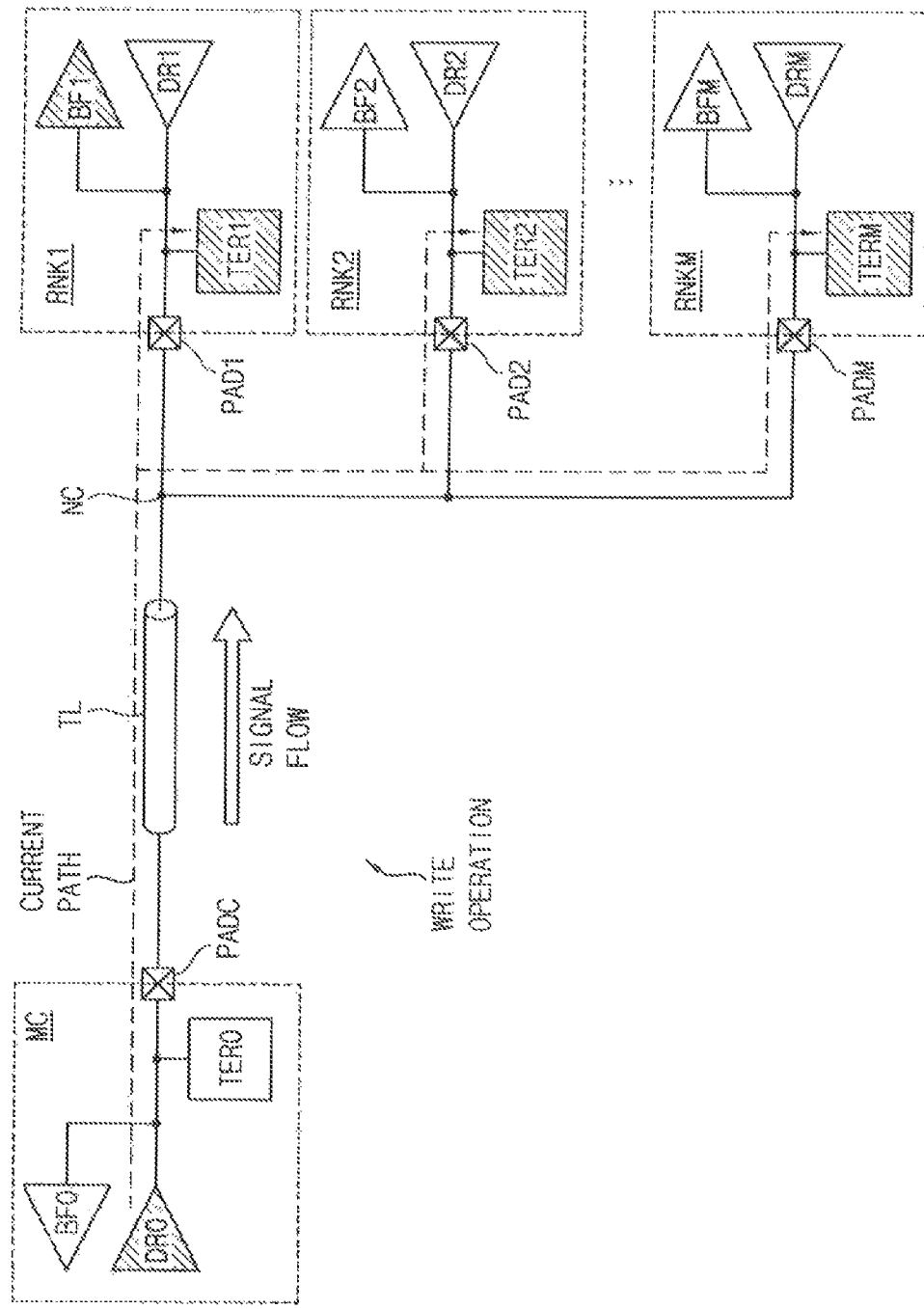
FIGS. 7, 8A and 8B are diagrams illustrating a method of controlling ODT in a write operation according to an exemplary embodiment of the inventive concept.
Figure 8A:
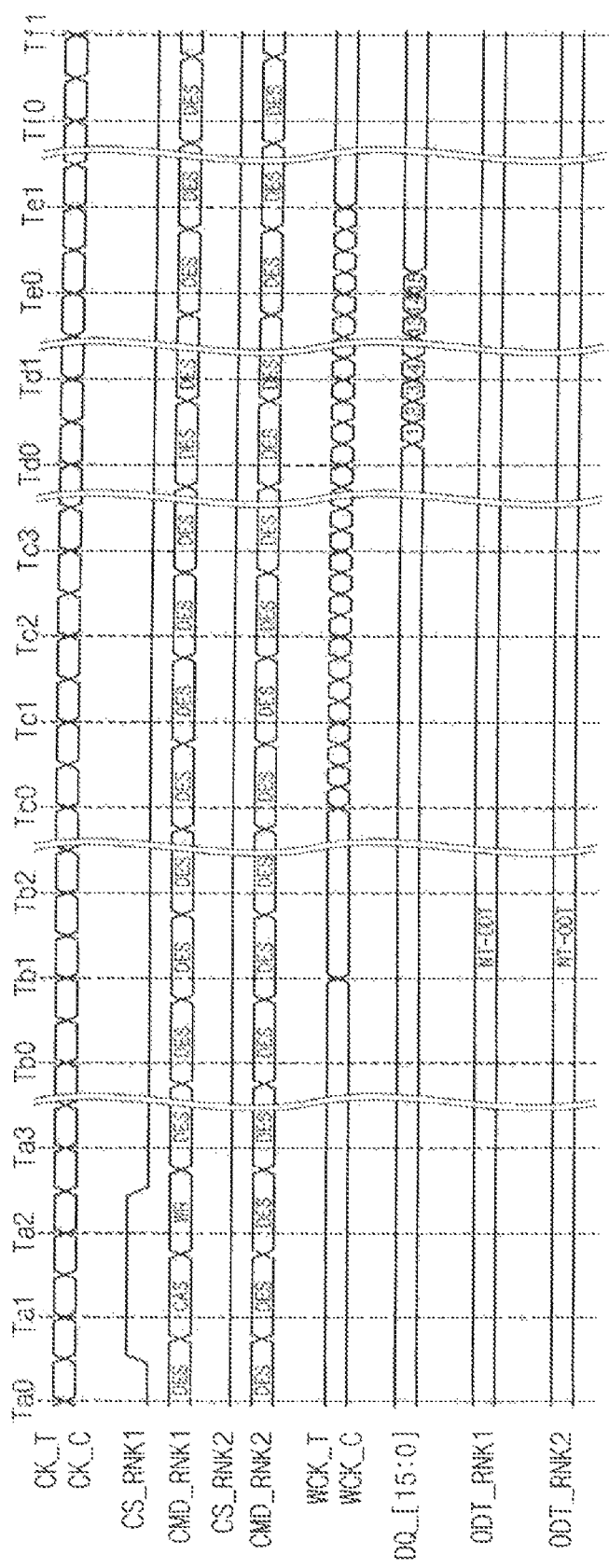
Figure 8B:
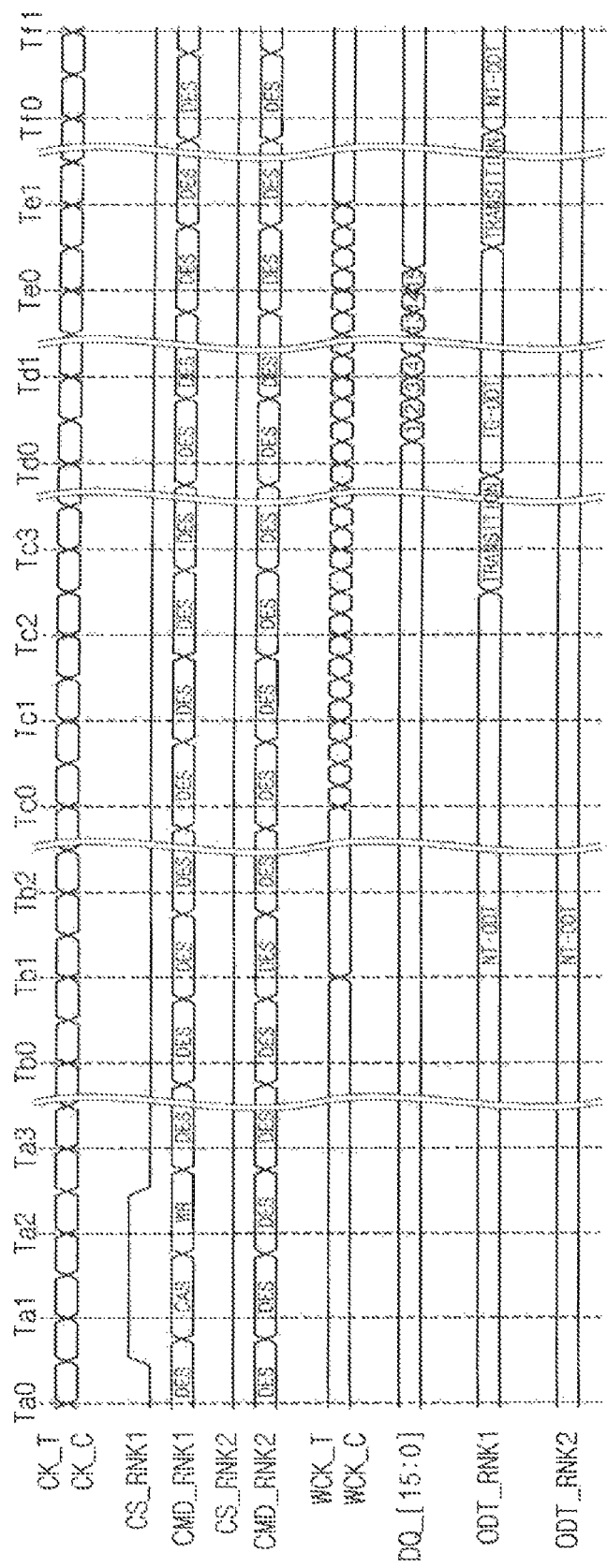

FIGS. 7, 8A and 8B are diagrams illustrating a method of controlling ODT in a write operation according to an exemplary embodiment of the inventive concept.

As illustrated in FIG. 7, the memory controller MC is connected in parallel to the plurality of memory ranks RNK1-RNKM through the data input-output pins PADC and PAD1-PADM and the transmission line TL. The transmission line TL is branched at a common node NC to the data input-output pins PAD1-PADM of the memory ranks RNK1-RNKM.

FIG. 7 illustrates an exemplary case where the first memory rank RNK1 corresponds to the write target memory rank and the other memory ranks RNK2-RNKM correspond to the non-target memory ranks. In FIG. 7, the enabled elements are hatched. In the write operation, the transmission driver DR0 is enabled and the reception buffer BF0 is disabled in the memory controller MC corresponding to the data transmitter device. In addition, the reception buffer BF1 is enabled in the write target memory rank RNK1 corresponding to the data receiver device, whereas the transmission driver DR1 in the write target memory rank RNK1, the reception buffers BF2-BFM and the transmission drivers DR2-DRM in the non-target memory ranks RNK2-RNKM are disabled.

According to an exemplary embodiment, during the write operation, the ODT circuit TER1 in the write target memory rank RNK1 and the ODT circuits TER2-TERM in the non-target memory ranks RNK2-RNKM are all enabled. The ODT circuit TER0 in the memory controller MC is disabled. The current path may be formed from the transmission driver DR0 in the memory controller MC to all of the ODT circuits TER1-TERM in the memory ranks RNK1-RNKM and thus signal reflection may be reduced and signal integrity may be enhanced.

In FIGS. 8A and 8B, time points Ta0-Tf1 correspond to edges of operation clock signal pair CK_T and CK_C. A first rank selection signal CS_RNK1 and a first command signal CMD_RNK1 are dedicated to a first memory rank RNK1 and a second rank selection signal CS_RNK2 and a second command signal CMD_RNK2 are dedicated to a second memory rank RNK2. A data strobe signal pair WCK_T and WCK_C and data signals DQ[15:0] are provided from the memory controller MC to the write target memory rank RNK1. ODT_RNK1 represents an ODT state of the first memory rank RNK1 and ODT_RNK2 represents an ODT state of the second memory rank RNK2. DES represents "deselect" and TRANSITION represents transition intervals when the ODT state is changed.

FIGS. 8A and 8B show an example case of the write operation when the first memory rank RNK1 corresponds to the write target memory rank and the second memory rank RNK2 corresponds to the non-target memory rank. While the first rank selection signal CS_RNK1 is activated, the CAS command and the write command WR are transferred through the first command signal CMD_RNK1, and the second rank selection signal CS_RNK2 and the second command signal CMD_RNK2 maintain the deactivated states.

According to an exemplary embodiment, during the write operation, the ODT circuits in the write target memory rank RNK1 and the ODT circuit in the non-target memory rank RNK2 is enabled. In an exemplary embodiment, as illustrated in FIG. 8A, the ODT circuits in the write target memory rank RNK1 and the non-target memory rank RNK2 maintain the initial state NT-ODT while the data signals DQ[15:0] for the write operation are toggling. In an exemplary embodiment, the ODT circuit in the non-target memory rank RNK2 maintains the initial state NT-ODT and the ODT circuit in the write target memory rank RNK1 is changed into a state TG-ODT having a resistance value different from that of the initial state NT-ODT while the data signals DQ[15:0] for the write operation are toggling. While data signals of 16 bit data are described above, the inventive concept is not limited thereto since the size of the data may be less than 16 bits or greater than 16 bits in alternate embodiments.

Figure 10:
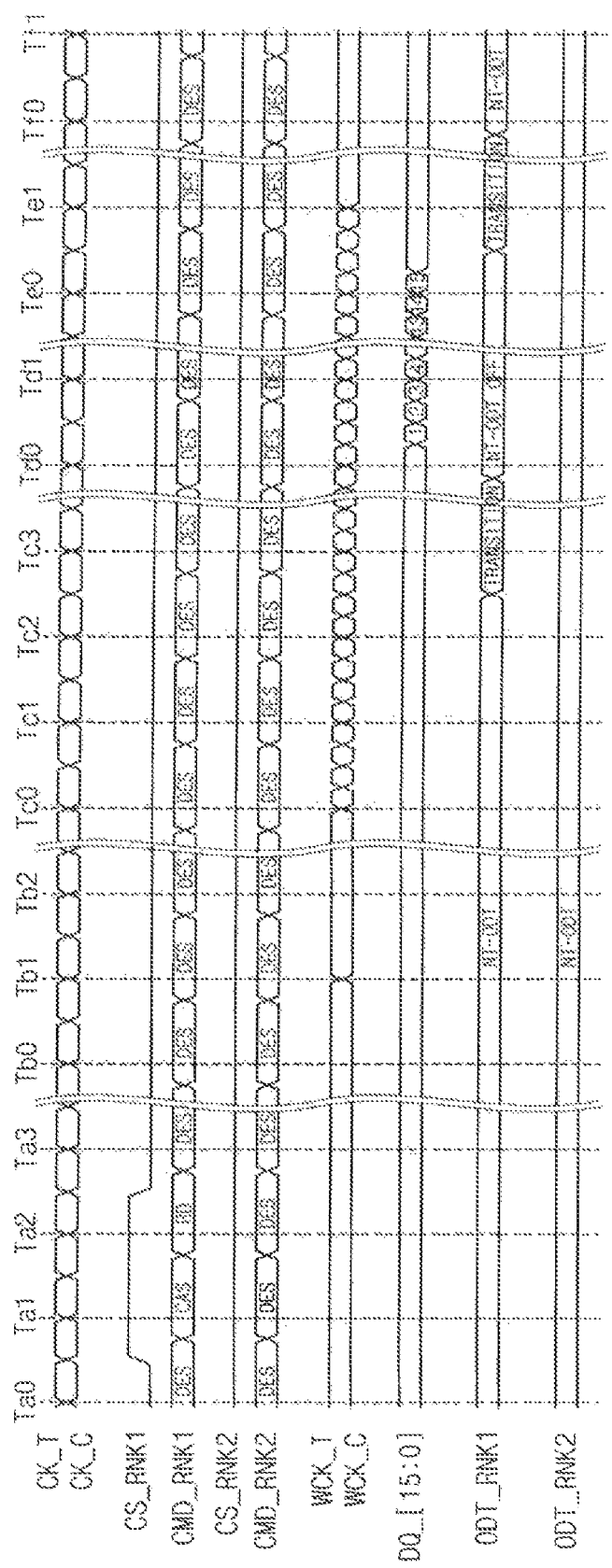

FIGS. 9 and 10 are diagrams illustrating a method of controlling ODT in a read operation according to an exemplary embodiment of the inventive concept.

As illustrated in FIG. 9, the memory controller MC is connected in parallel to the plurality of memory ranks RNK1-RNKM through the data input-output pins PADC and PAD1-PADM and the transmission line TL. The transmission line TL is branched at a common node NC to the data input-output pins PAD1-PADM of the memory ranks RNK1-RNKM.

FIG. 9 illustrates an exemplary case where the first memory rank RNK1 corresponds to the read target memory rank and the other memory ranks RNK2-RNKM correspond to the non-target memory ranks. In FIG. 9, the enabled elements are hatched. In the read operation, the reception buffer BF0 is enabled and the transmission driver DR0 is disabled in the memory controller MC corresponding to the data receiver device. In addition, the transmission driver DR1 is enabled in the read target memory rank RNK1 corresponding to the data transmitter device, whereas the reception buffer BF1 in the read target memory rank RNK1, the reception buffers BF2-BFM and the transmission drivers DR2-DRM in the non-target memory ranks RNK2-RNKM are disabled.

According to an exemplary embodiment, during the read operation, the ODT circuit TER1 in the write target memory rank RNK1 is disabled and the ODT circuits TER2-TERM in the non-target memory ranks RNK2-RNKM are enabled. The ODT circuit TER0 in the memory controller MC is enabled. The current path may be formed from the transmission driver DR1 in the read target memory rank RNK1 to the ODT circuit TER0 in the transmission driver DR0 and the ODT circuits TER2-TERM in the non-target memory ranks RNK2-RNKM and thus signal reflection may be reduced and signal integrity may be enhanced.

In FIG. 10, time points Ta0Tf1 correspond to edges of an operation clock signal pair CK_T and CK_C. A first rank selection signal CS_RNK1 and a first command signal CMD_RNK1 are dedicated to a first memory rank RNK1 and a second rank selection signal CS_RNK2 and a second command signal CMD_RNK2 are dedicated to a second memory rank RNK2. A data strobe signal pair WCK_T and WCK_C and data signals DQ[15:0] are provided from the read target memory rank RNK1 to the memory controller MC. ODT_RNK1 represents an ODT state of the first memory rank RNK1 and ODT_RNK2 represents an ODT state of the second memory rank RNK2. DES represents "deselect" and TRANSITION represents transition intervals when the ODT state is changed.

FIG. 10 shows an example case of the read operation when the first memory rank RNK1 corresponds to the read target memory rank and the second memory rank RNK2 corresponds to the non-target memory rank. While the first rank selection signal CS_RNK1 is activated, the CAS command and the read command RD are transferred through the first command signal CMD_RNK1, and the second rank selection signal CS_RNK2 and the second command signal CMD_RNK2 maintain the deactivated states.

According to an exemplary embodiment, during the read operation, the ODT circuit in the read target memory rank RNK1 is disabled and the ODT circuit in the non-target memory rank RNK2 is enabled. In an exemplary embodiment, as illustrated in FIG. 10, the ODT circuit in the non-target memory rank RNK2 maintains the initial state NT-ODT and the ODT circuit in the read target memory rank RNK1 is changed into the disabled state NT-ODT OFF while the data signals DQ[15:0] for the read operation are toggling.

Figures 11, 12:
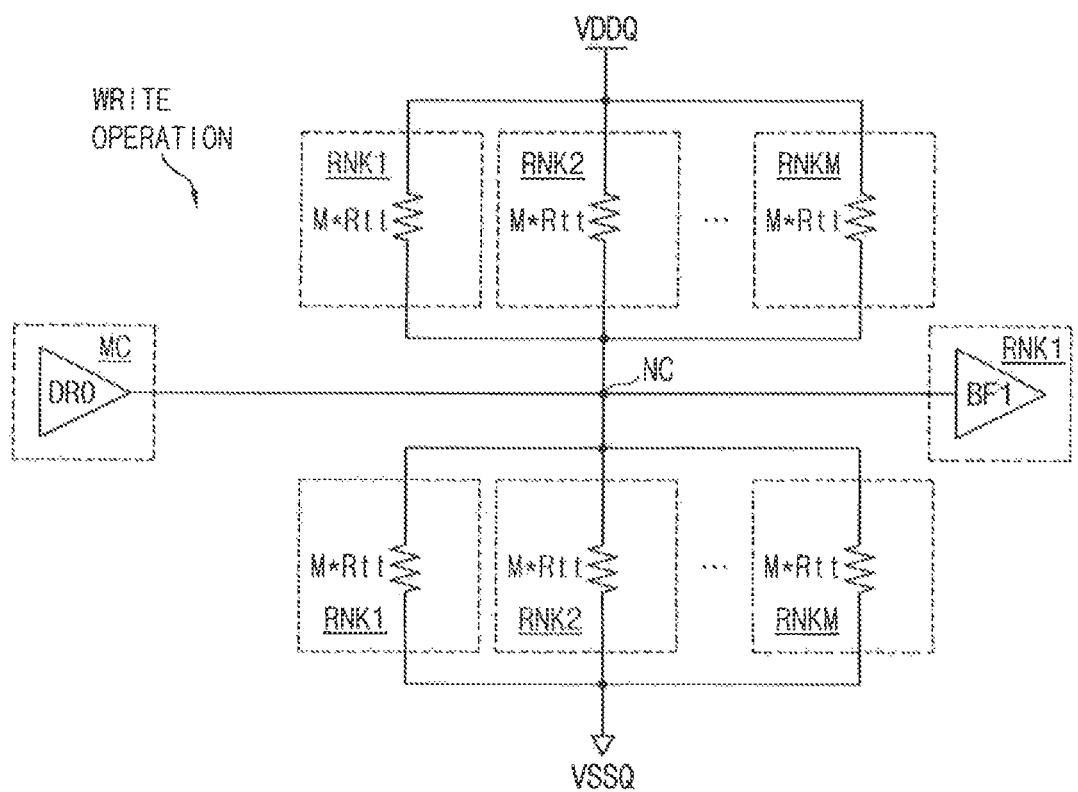
FIG. 11 is a diagram illustrating an embodiment of resistance setting applied to a method of controlling ODT according to an exemplary embodiment of the inventive concept.
FIG. 12 is a diagram for describing an equivalent resistance of the ODT circuit in a write operation corresponding to the resistance setting of FIG. 11.

FIG. 11 is a diagram illustrating an embodiment of a resistance setting applied to a method of controlling ODT according to an exemplary embodiment of the inventive concept.

Referring to FIG. 11, during the read operation, the ODT circuit in the target memory rank RNK_TG is disabled and the ODT circuits in the non-target memory rank RNK_NT and the memory controller MC have a first resistance value M*Rtt. During the write operation, the ODT circuits in the target memory rank RNK_TG and the non-target memory rank RNK_NT have the first resistance value M*Rtt and the ODT circuit in the memory controller MC is disabled. The first resistance value M*Rtt may correspond to a resistance value of the above-mentioned initial state. Accordingly, as described with reference to FIG. 8A, the ODT circuits in the target memory rank RNK_TG and the non-target memory rank RNK_NT may maintain the initial state to have the first resistance value M*Rtt during the write operation.

FIG. 12 is a diagram for describing an equivalent resistance of the ODT circuit in a write operation corresponding to the resistance setting of FIG. 11.

Referring to FIG. 12, during the write operation while data is transferred from the memory controller MC to the target memory rank RNK1, all ODT circuits in the target memory rank RNK1 and the non-target memory ranks RNK2-RNKM have the first resistance value M*Rtt. When the number of the plurality of memory ranks RNK1-RNKM is M, M resistors having the first resistance value M*Rtt are connected in parallel between the common node NC and the power supply voltage VDDQ and the equivalent resistance value between the common node NC and the power supply voltage VDDQ corresponds to Rtt. In the same way, the equivalent resistance value between the common node NC and the ground voltage VSSQ corresponds to Rtt. The various termination schemes corresponding to the equivalent resistance value Rtt will be described below with reference to FIGS. 14A through 16B.

Figure 13:
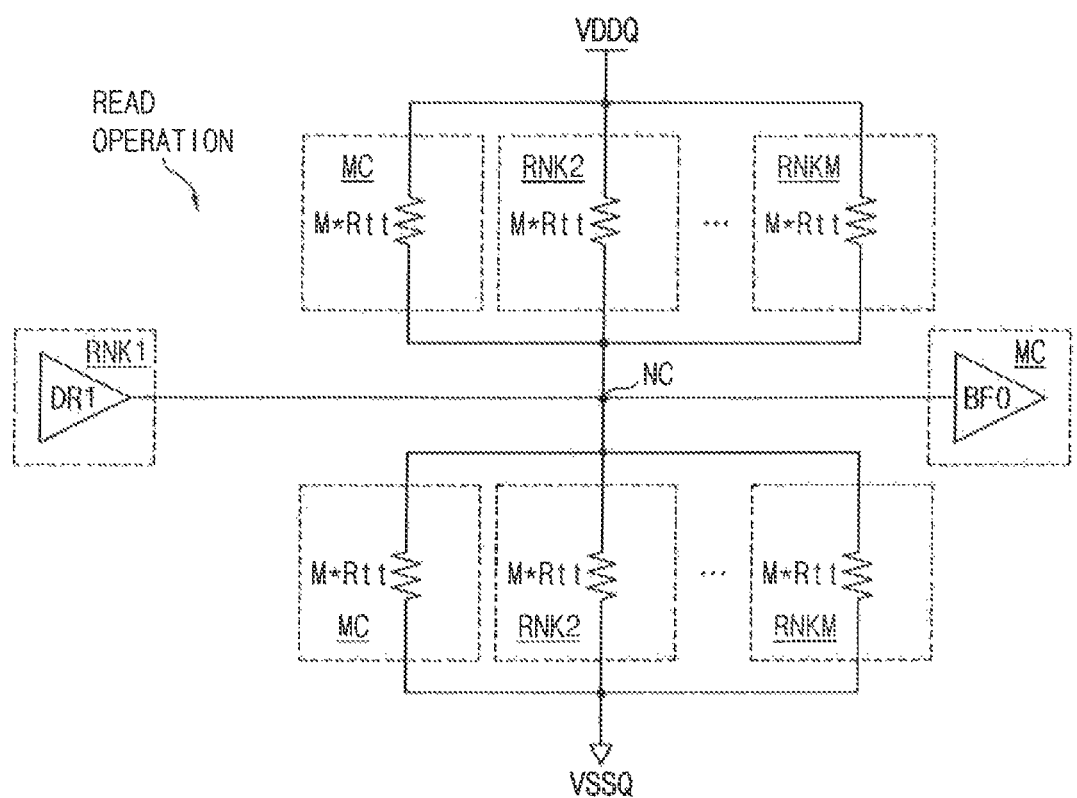
FIG. 13 is a diagram for describing an equivalent resistance of the ODT circuit in a read operation corresponding to the resistance setting of FIG. 11.

FIG. 13 is a diagram for describing an equivalent resistance of the ODT circuit in a read operation corresponding to the resistance setting of FIG. 11.

Referring to FIG. 13, during the read operation while data is transferred from the target memory rank RNK1 to the memory controller MC, the ODT circuit in the target memory rank RNK1 is disabled and the ODT circuits in the non-target memory ranks RNK2-RNKM and the memory controller MC have the first resistance value M*Rtt. When the number of the plurality of memory ranks RNK1-RNKM is M, M resistors having the first resistance value M*Rtt are connected in parallel between the common node NC and the power supply voltage VDDQ and the equivalent resistance value between the common node NC and the power supply voltage VDDQ corresponds to Rtt. In the same way, the equivalent resistance value between the common node NC and the ground voltage VSSQ corresponds to Rtt. The various termination schemes corresponding to the equivalent resistance value Rtt will be described below with reference to FIGS. 14A through 16B. The configurations of FIGS. 14A through 16B are exemplary embodiments for describing a few possible termination schemes, but configuration of the transmission driver and the ODT circuit are not limited thereto. For example, the N-type and the P-type of the transistors may be exchanged and/or the transistors for power gating may be added to the transmission driver.

FIGS. 14A and 14B are diagrams for describing a center-tapped termination (CTT).

Referring to FIG. 14A, a transmission driver 70 in a transmitter device drives an input-output pad PADH based on a transmission signal ST from an internal signal of the transmitter device. The input-output pad PADH of the transmitter device is connected to input-output pad PADS of a receiver device through a transmission line TL. A termination circuit 80 of the CTT scheme is connected to the input-output pad PADS of the receiver device for impedance matching. The reception buffer BF in the receiver device may compare the input signal SI through the input-output pad PADS with the reference voltage VREF to provide the buffer signal SB to an internal circuit of the receiver device.

The transmission driver 70 may include a pull-up unit connected between a first power supply voltage VDDQ and the input-output pad PADH and a pull-down unit connected between the input-output pad PADH and a second power supply voltage VSSQ lower than the first power supply voltage VDDQ. The pull-up unit may include a turn-on resistor RON and a p-channel metal oxide semiconductor (PMOS) transistor TP1 that is switched in response to the transmission signal ST. The pull-down unit may include a turn-on resistor RON and a n-channel metal oxide semiconductor (NMOS) transistor TN1 that is switched in response to the transmission signal ST. The turn-on resistors RON may be omitted and each turn-on resistor RON may represent a resistance between the voltage node and the input-output pad PADH when each of the transistors TP1 and TN1 is turned on.

The termination circuit 80 of the CTT scheme may include a first sub termination circuit connected between the first power supply voltage VDDQ and the input-output pad PADS and a second sub termination circuit connected between the input-output pad PADS and the second power supply voltage VSSQ. The first sub termination circuit may include a termination resistor Rtt and a PMOS transistor TP2 that is turned on in response to a low voltage. The second sub termination circuit may include a termination resistor Rtt and an NMOS transistor TN2 that is turned on in response to a high voltage. The termination resistors Rtt may be omitted and each termination resistor Rtt may represent a resistance between the voltage node and the input-output pad PADS when each of the transistors TP2 and TN2 is turned on.

In case of the termination circuit 80 of the CTT scheme in FIG. 14A, the high voltage level VIH and the low voltage level VIL of the input signal SI may be represented as FIG. 14B. The second power supply voltage VSSQ may be assumed to be a ground voltage (i.e., VSSQ=0) and the voltage drop along the transmission line TL may be neglected. Thus the high voltage level VIH, the low voltage level VIL and the optimal reference voltage VREF may be calculated according to Expression 1.

$$VIH=VDDQ*(RON+Rtt)/(2RON+Rtt),$$

$$VIL=VDDQ*RON/(2RON+Rtt),$$

$$VREF=(VIH+VIL)/2=VDDQ/2 \qquad \text{Expression 1}$$

Figure 15A:
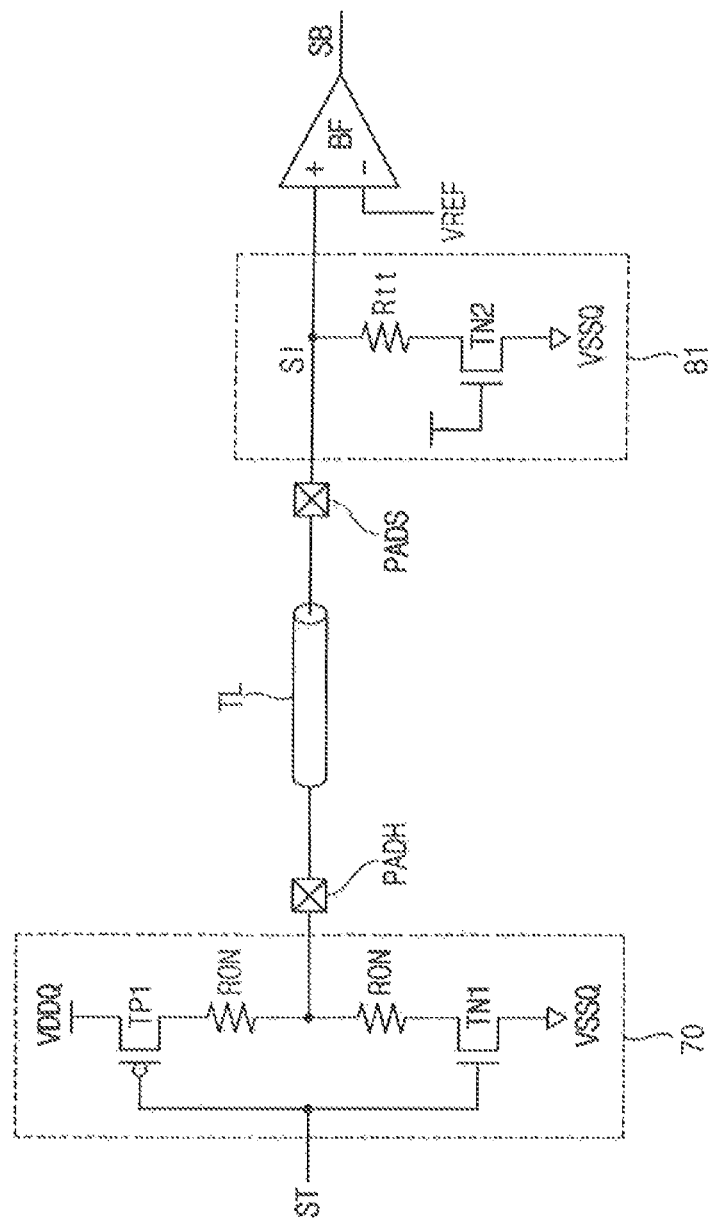
FIGS. 15A and 15B are diagrams for describing a first pseudo-open drain (POD) termination.
Figure 15B:
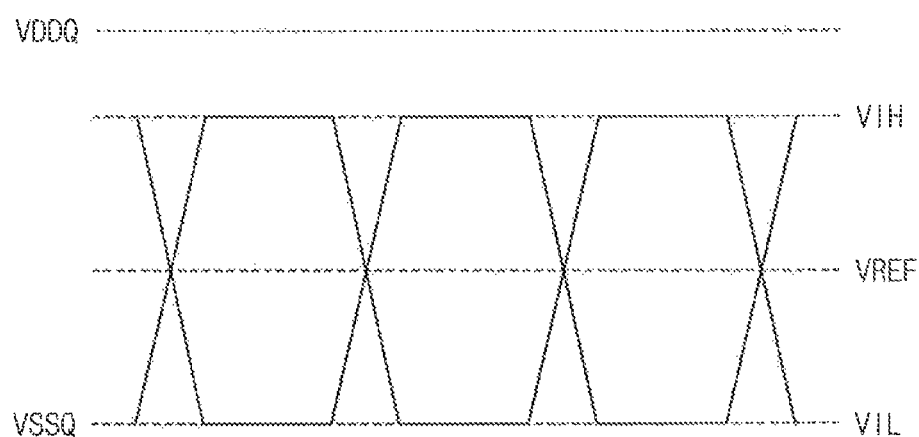

FIGS. 15A and 15B are diagrams for describing a first pseudo-open drain (POD) termination.

Referring to FIG. 15A, a transmission driver 70 in a transmitter device drives an input-output pad PADH based on a transmission signal ST from an internal signal of the transmitter device. The input-output pad PADH of the transmitter device is connected to input-output pad PADS of a receiver device through a transmission line TL. A termination circuit 81 of the first POD termination scheme may be connected to the input-output pad PADS of the receiver device for impedance matching. The reception buffer BF in the receiver device may compare the input signal SI through the input-output pad PADS with the reference voltage VREF to provide the buffer signal SB to an internal circuit of the receiver device.

The transmission driver 70 may include a pull-up unit connected between a first power supply voltage VDDQ and the input-output pad PADH and a pull-down unit connected between the input-output pad PADH and a second power supply voltage VSSQ lower than the first power supply voltage VDDQ. The pull-up unit may include a turn-on resistor RON and a PMOS transistor TP1 that is switched in response to the transmission signal ST. The pull-down unit may include a turn-on resistor RON and an NMOS transistor TN1 that is switched in response to the transmission signal ST. The turn-on resistors RON may be omitted and each turn-on resistor RON may represent a resistance between the voltage node and the input-output pad PADH when each of the transistors TP1 and TN1 is turned on.

The termination circuit 81 of the first POD termination scheme may include a termination resistor Rtt and an NMOS transistor TN2 that is turned on in response to a high voltage. The termination resistor Rtt may be omitted and the termination resistor Rtt may represent a resistance between the voltage node and the input-output pad PADS when the NMOS transistor TN2 is turned on.

In case of the termination circuit 81 of the first POD termination scheme in FIG. 15A, the high voltage level VIH and the low voltage level VIL of the input signal SI may be represented as FIG. 15B. The second power supply voltage VSSQ may be assumed to be a ground voltage (i.e., VSSQ=0) and the voltage drop along the transmission line TL may be neglected. Thus the high voltage level VIH, the low voltage level VIL and the optimal reference voltage VREF may be calculated according to Expression 2.

$$VIH=VDDQ*RTT/(RON+RTT),$$

$$VIL=VSSQ=0,$$

$$VREF=(VIH+VIL)/2=VDDQ*RTT/2(RON+RTT) \quad \text{Expression 2}$$

Figure 16A:
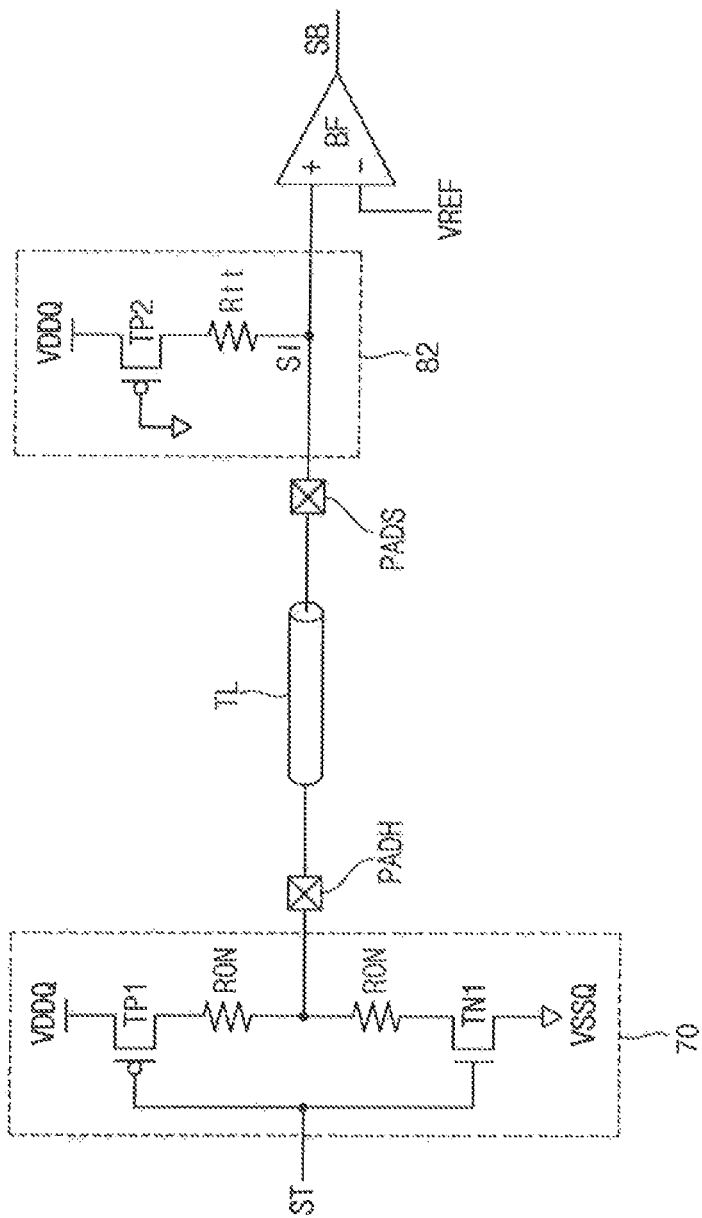
FIGS. 16A and 16B are diagrams for describing a second POD termination.
Figures 16B, 17:
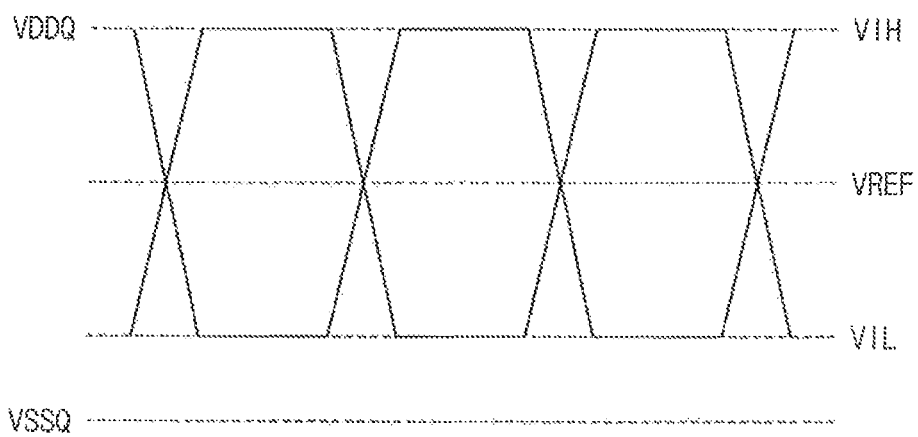
FIG. 17 is a diagram illustrating an embodiment of resistance setting applied to a method of controlling ODT according to an exemplary embodiment of the inventive concept.

FIGS. 16A and 16B are diagrams for describing a second POD termination.

Referring to FIG. 16A, a transmission driver 70 in a transmitter device drives an input-output pad PADH based on a transmission signal ST from an internal signal of the transmitter device. The input-output pad PADH of the transmitter device is connected to input-output pad PADS of a receiver device through a transmission line TL. A termination circuit 82 of the second POD termination scheme is connected to the input-output pad PADS of the receiver device for impedance matching. The reception buffer BF in the receiver device may compare the input signal SI through the input-output pad PADS with the reference voltage VREF to provide the buffer signal SB to an internal circuit of the receiver device.

The transmission driver 70 may include a pull-up unit connected between a first power supply voltage VDDQ and the input-output pad PADH and a pull-down unit connected between the input-output pad PADH and a second power supply voltage VSSQ lower than the first power supply voltage VDDQ. The pull-up unit may include a turn-on resistor RON and a PMOS transistor TP1 that is switched in response to the transmission signal ST. The pull-down unit may include a turn-on resistor RON and an NMOS transistor TN1 that is switched in response to the transmission signal ST. The turn-on resistors RON may be omitted and each turn-on resistor RON may represent a resistance between the voltage node and the input-output pad PADH when each of the transistors TP1 and TN1 is turned on.

The termination circuit 82 of the second POD termination scheme may include a termination resistor Rtt and a PMOS transistor TP2 that is turned on in response to a low voltage. The termination resistor Rtt may be omitted and the termination resistor Rtt may represent a resistance between the voltage node and the input-output pad PADS when the NMOS transistor TN2 is turned on.

In case of the termination circuit 82 of the first POD termination scheme in FIG. 16A, the high voltage level VIH and the low voltage level VIL of the input signal SI may be represented as FIG. 16B. The second power supply voltage VSSQ may be assumed to be a ground voltage (i.e., VSSQ=0) and the voltage drop along the transmission line TL may be neglected. Thus the high voltage level VIH, the low voltage level VIL and the optimal reference voltage VREF may be calculated according to Expression 3.

$$VIH=VDDQ,$$

$$VIL=VDDQ*RON/(RON+Rtt),$$

$$VREF=(VIH+VIL)/2=VDDQ*(2RON+Rtt)/2(RON+Rtt) \quad \text{Expression 3}$$

As such, the ODT circuit according to at least one exemplary embodiment may adopt various termination schemes. In an exemplary embodiment, a training process is performed to obtain the optimal reference voltages VREF according to Expressions 1, Expression 2 and Expression 3. In an exemplary embodiment, the memory controller considers the ODT resistors of the non-target memory ranks that are enabled continuously to adjust the resistance value of the ODT circuit in the memory controller or the turn-on resistance value of the transmission driver in the memory controller.

FIG. 17 is a diagram illustrating an embodiment of the resistance setting applied to a method of controlling ODT according to an exemplary embodiment of the inventive concept.

Referring to FIG. 17, during the read operation, the ODT circuit in the target memory rank RNK_TG is disabled and the ODT circuits in the non-target memory rank RNK_NT and the memory controller MC have a first resistance value M*Rtt. During the write operation, the ODT circuit in the target memory rank RNK_TG has a second resistance value M*Rtt+Rtg different from the first resistance value M*Rtt, the ODT circuit in the non-target memory rank RNK_NT has the first resistance value M*Rtt and the ODT circuit in the memory controller MC is disabled. The first resistance value M*Rtt may correspond to a resistance value of the above-mentioned initial state. For example, the first resistance value M*Rtt may be about 70Ω and the second resistance value M*Rtt+Rtg may be about 150Ω. Accordingly, as described with reference to FIG. 8B, the resistance value of the ODT circuit in the target memory rank RNK_TG may be changed from the first resistance value M*Rtt to the second resistance value M*Rtt+Rtg and the ODT circuit in the non-target memory rank RNK_NT may maintain the initial state to have the first resistance value M*Rtt during the write operation. In an embodiment, the second resistance value is greater than the first resistance value, the ODT circuit of the target memory rank RNK_TG is disabled and the ODT circuits of the non-target memory ranks RNK_NT are enabled and set to the first resistance value during a read operation, and the ODT circuit of the target memory rank is enabled and set to the second resistance during a write operation.

FIG. 18 is a diagram illustrating a CAS command according to an exemplary embodiment.

FIG. 18 illustrates an exemplary CAS command conforming to the low power double data rate 5 (LPDDR5) standard. Referring to FIG. 18, a CAS command may be represented as a combination of command-address signals CA0~CA5. "L" represents a logic low level, "H" represents a logic high level, EDC_EN, WS_RD, WS_FAST, DC0-DC3, NT0, NT1 and BL represent field values forming the CAS command. Particularly NT0 and NT1 represent the field values for termination control.

As illustrated in FIG. 18, when the static ODT control according to an exemplary embodiment is adopted, NT0 and NT1 may be omitted and the corresponding portion may be reserved for future use (RFU).

FIGS. 19A and 19B are diagrams for describing a mode register for ODT according to an exemplary embodiment.

The information for the ODT control may be stored in the mode register 412 in FIG. 4. For example, the corresponding portion of the mode register 412 may have mode register settings MRSET as illustrated in FIGS. 19A and 19B. Some values of operands OP0-OP7 may represent information on a resistance value of the ODT circuit.

FIG. 19A shows a value ODT for commonly controlling the resistance value of the ODT circuits in the target memory rank and the non-target memory rank as described with reference to FIG. 8A. FIG. 19B shows a first value TG-ODT for controlling the first resistance value of the ODT circuit in the target memory rank and a second value NT-ODT for controlling the second resistance value of the ODT circuit in the non-target memory rank as described with reference to FIG. 8B. The values ODT, TG-ODT and NT-ODT stored in the mode register 412 may be provided from the memory controller to the memory ranks through a mode register write operation. The above-mentioned strength code SCD may be provided based on the values ODT, TG-ODT and NT-ODT.

Figure 20:
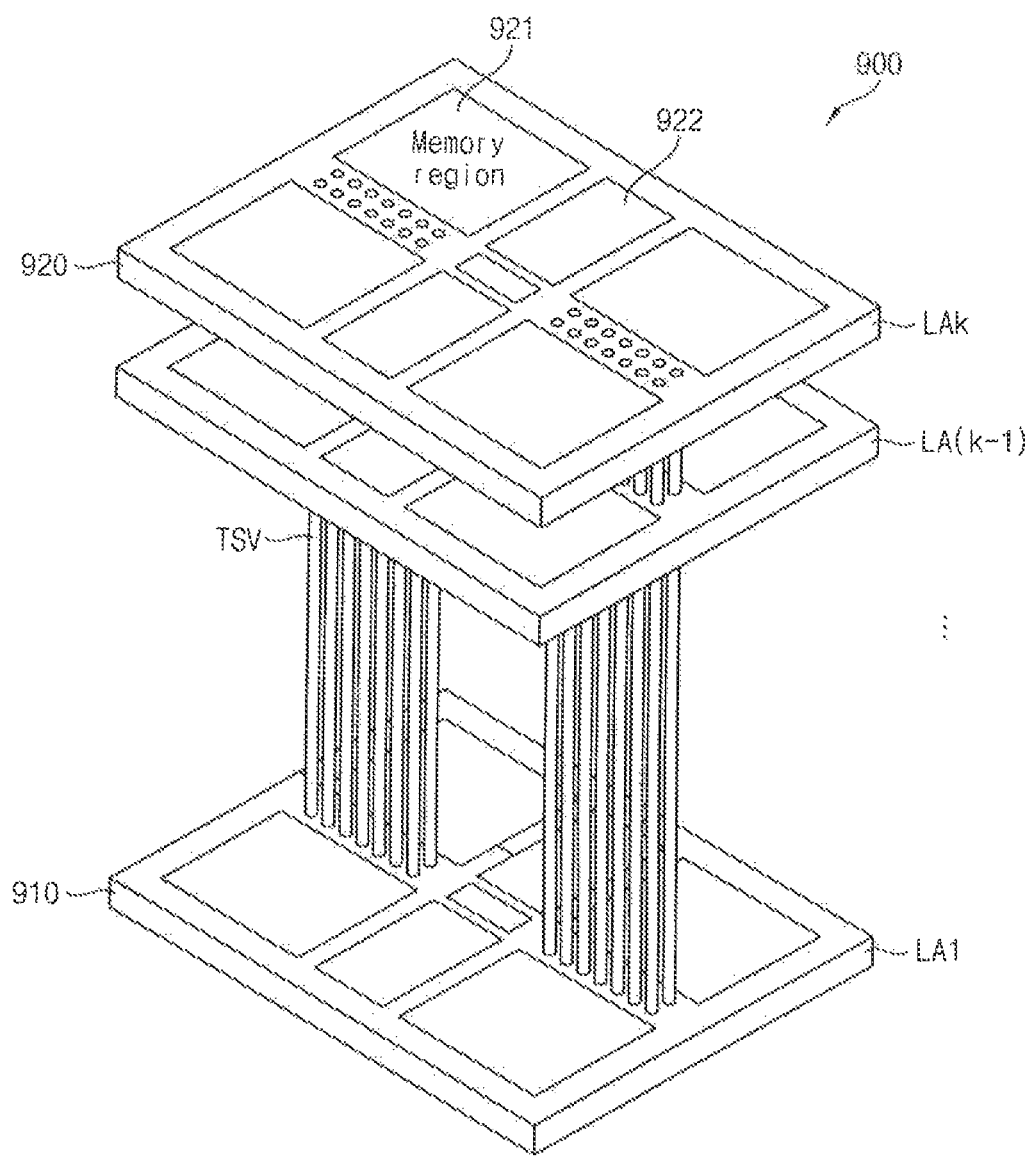
FIG. 20 is a structural diagram illustrating a semiconductor memory device according to an exemplary embodiment of the inventive concept.

FIG. 20 is a structural diagram illustrating a semiconductor memory device according to an exemplary embodiment of the inventive concept.

Referring to FIG. 20, a semiconductor memory device 900 includes first through kth semiconductor integrated circuit layers LA1 through LAk, in which the lowest first semiconductor integrated circuit layer LA1 is assumed to be an interface or control chip and the other semiconductor integrated circuit layers LA2 through LAk are assumed to be slave chips including core memory chips. The slave chips may form a plurality of memory ranks as described above.

The first through kth semiconductor integrated circuit layers LA1 through LAk may transmit and receive signals between the layers by through-substrate vias TSVs (e.g., through-silicon vias). The lowest first semiconductor integrated circuit layer LA1 as the interface or control chip may communicate with an external memory controller through a conductive structure formed on an external surface.

Each of the first semiconductor integrated circuit layer 910 through the kth semiconductor integrated circuit layer 920 may include memory regions 921 and peripheral circuits 922 for driving the memory regions 921. For example, the peripheral circuits 922 may include a row-driver for driving wordlines of a memory, a column-driver for driving bit lines of the memory, a data input-output circuit for controlling input-output of data, a command buffer for receiving a command from an outside source and buffering the command, and an address buffer for receiving an address from an outside source and buffering the address.

The first semiconductor integrated circuit layer 910 may further include a control circuit. The control circuit may control access to the memory region 921 based on a command and an address signal from a memory controller and may generate control signals for accessing the memory region 921.

Figure 21:
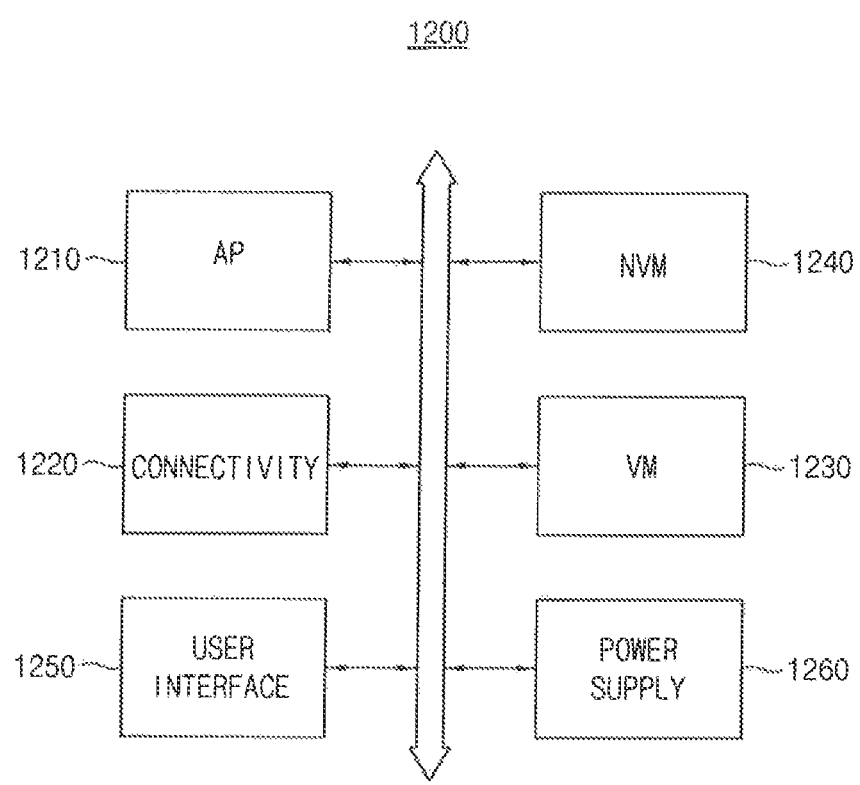
FIG. 21 is a block diagram illustrating a mobile system according to an exemplary embodiment of the inventive concept.

FIG. 21 is a block diagram illustrating a mobile system according to an exemplary embodiment of the inventive concept.

Referring to FIG. 21, a mobile system 1200 includes an application processor 1210, a connectivity circuit 1220, a volatile memory device (VM) 1230, a nonvolatile memory device (NVM) 1240, a user interface 1250, and a power supply 1260.

The application processor 1210 may execute computer instructions stored in computer-readable media (e.g., memory devices), including applications such as a web browser, a game application, a video player, etc. The connectivity circuit 1220 may perform wired or wireless communication with an external device. The volatile memory device 1230 may store data processed by the application processor 1210, or may operate as a working memory. For example, the volatile memory device 1230 may be a dynamic random access memory, such as double data rate synchronous dynamic random-access memory (DDR SDRAM), low power double data rate synchronous dynamic random-access memory (LPDDR SDRAM), graphics double data rate synchronous dynamic random-access memory (GDDR SDRAM), Rambus dynamic random-access memory (RDRAM), etc. The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200. In an exemplary embodiment, the mobile system 1200 further includes a camera image processor (CIS), and/or a storage device, such as a memory card, a solid state drive (SSD), a hard disk drive (HDD), a CD-ROM, etc.

The volatile memory device 1230 and/or the nonvolatile memory device 1240 may have configuration for performing the method of controlling ODT according to the exemplary embodiments as described with reference to FIGS. 1 through 19B.

As described above, the method of controlling ODT and the system performing the method according to an exemplary embodiment may reduce power consumption and enhance signal integrity through static ODT control such that the ODT circuits of the target memory rank and the non-target memory ranks are maintained generally in the enabled state whereas the ODT circuit of the read target memory rank is disabled during the read operation.

Embodiments of the present inventive concept may be applied to various devices and systems including a memory device. For example, the present inventive concept may be applied to systems such as a memory card, a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of exemplary embodiments of the inventive concept and is not to be construed as limiting thereof. Although a few exemplary embodiments have been described, those skilled in the art will readily appreciate that many modifications are possible in the exemplary embodiments without materially departing from the present inventive concept.

What is claimed is:

1. A method of operating a dynamic random access memory (DRAM) in a multi-rank memory system, the multi-rank memory system including a first rank and a second rank, the first rank being enabled by a first rank selection signal and the second rank being enabled by a second rank selection signal respectively, the method comprising:
setting a mode register set to enable one of first on-die-termination (ODT) operation mode and second on-die-termination (ODT) operation mode;
receiving a first CAS command and a write command consecutively in synchronization with an operation clock signal pair from an external device through a command bus shared by the first and second ranks while the first rank selection signal is being enabled and the second rank selection signal is being disabled;
receiving a write data from the external device through a data bus shared by the first and second ranks after receiving the first CAS command and the write command, wherein, when the first ODT operation mode is enabled, a first ODT circuit of the first rank and a second ODT circuit of the second rank are enabled respectively while receiving the write data, and when the second ODT operation mode is enabled, the first ODT circuit of the first rank is enabled and the second ODT circuit of the second rank is disabled while receiving the write data;
receiving a data strobe signal pair while receiving the write data, the data strobe signal pair toggles in synchronization with the operation clock signal pair, wherein toggling frequency of the data strobe signal pair is higher than a frequency of the operation clock signal pair;
receiving a second CAS command and a read command consecutively through the command bus while the first rank selection signal is being enabled and the second rank selection signal is being disabled; and
outputting a read data through the data bus in response to the second CAS command and the read command, wherein, when the first ODT operation mode is enabled, the first ODT circuit of the first rank is disabled and the second ODT circuit of the second rank is enabled respectively while outputting the read data, and when the second ODT operation mode is enabled, the first ODT circuit of the first rank and the second ODT circuit of the second rank are disabled respectively while outputting the read data.

2. The method of claim 1, wherein the toggling frequency of the data strobe signal pair is twice higher than the frequency of the operation clock signal pair.

3. The method of claim 1, wherein the toggling frequency of the data strobe signal pair is four times higher than the frequency of the operation clock signal pair.

4. The method of claim 1, wherein the first CAS command includes a first field which indicates that the write command is immediately followed, and the logic level of the first field is high.

5. The method of claim 1, wherein the second CAS command includes a second field which indicates that the read command is immediately followed, and the logic level of the second field is high.

6. The method of claim 1, further setting a second mode register to set a first resistance value of the first ODT circuit and to set a second resistance value of the second ODT circuit.

7. The method of claim 1, wherein the first memory rank is a target memory rank and the second memory rank is a non-target memory rank, and the DRAM in the target memory rank performs write and read operations in response to the write and read commands.

8. The method of claim 1, wherein, when the DRAM is powered-on, default setting of the mode register set is the first ODT operation mode.

9. The method of claim 8, wherein an ODT operation mode transitioning from the first ODT operation mode to the second ODT operation mode is accomplished by a mode register set programming procedure.

10. The method of claim 1, wherein an ODT resistance of the first ODT circuit is set to have a first value during the first ODT operation mode and a second value during the second ODT operation mode respectively, and the first value is different from the second value.

11. The method of claim 10, wherein the first value and second value are selected from several different resistance values stored in a second mode register set.

12. A multi-rank memory system, the multi-rank memory system comprising:
a mode register set configured to enable one of first on-die-termination (ODT) operation mode and second on-die-termination (ODT) operation mode;
a first rank including a first dynamic random access memory (DRAM), the first DRAM being enabled by a first rank selection signal;
a second rank including a second dynamic random access memory (DRAM), the second DRAM being enabled by a second rank selection signal;
an operation clock bus providing the first rank and the second rank with an operation clock signal pair;
a command bus shared by the first rank and the second rank and connected to an external device;
a data bus shared by the first rank and the second rank and connected to the external device; and
a data strobe bus shared by the first rank and the second rank and connected to the external device;
wherein the first DRAM configured to:
receive a first CAS command and a write command consecutively in synchronization with the operation clock signal pair through the command bus while the first rank selection signal is being enabled and the second rank selection signal is being disabled;
receive a write data through the data bus after receiving the first CAS command and the write command, and when the first ODT operation mode is enabled, a first ODT circuit of the first rank and a second ODT circuit of the second rank are enabled respectively while receiving the write data, and when the second ODT operation mode is enabled, the first ODT circuit of the first rank is enabled and the second ODT circuit of the second rank is disabled while receiving the write data;
receive a data strobe signal pair while receiving the write data, the data strobe signal pair toggles in synchronization with the operation clock signal pair, and toggling frequency of the data strobe signal pair is higher than a frequency of the operation clock signal pair;

receive a second CAS command and a read command consecutively through the command bus while the first rank selection signal is being enabled and the second rank selection signal is being disabled; and output a read data through the data bus in response to the second CAS command and the read command, and when the first ODT operation mode is enabled, the first ODT circuit of the first rank is disabled and the second ODT circuit of the second rank is enabled respectively while outputting the read data, and when the second ODT operation mode is enabled, the first ODT circuit of the first rank and the second ODT circuit of the second rank are disabled respectively while outputting the read data.

13. The multi-rank memory system of claim 12, wherein the toggling frequency of the data strobe signal pair is twice higher than the frequency of the operation clock signal pair.

14. The multi-rank memory system of claim 12, wherein the first CAS command includes a first field which indicates that the write command is immediately followed, and the logic level of the first field is high.

15. The multi-rank memory system of claim 12, wherein the second CAS command includes a second field which indicates that the read command is immediately followed, and the logic level of the second field is high.

16. The multi-rank memory system of claim 12, further setting a second mode register to set a first resistance value of the first ODT circuit and to set a second resistance value of the second ODT circuit.

17. The multi-rank memory system of claim 12, wherein the first memory rank is a target memory rank and the second memory rank is a non-target memory rank, and the DRAM in the target memory rank performs write and read operations in response to the write and read commands.

18. The multi-rank memory system of claim 12, wherein, when the DRAM is powered-on, default setting of the mode register set is the first ODT operation mode.

19. The multi-rank memory system of claim 18, wherein an ODT operation mode transitioning from the first ODT operation mode to the second ODT operation mode is accomplished by mode register set programming procedure.

20. The multi-rank memory system of claim 12, wherein an ODT resistance of the first ODT circuit is set to have a first value during the first ODT operation mode and a second value during the second ODT operation mode respectively, and the first value is different from the second value.

* * * * *